(12) United States Patent
Shimizu et al.

(10) Patent No.: US 9,453,951 B2
(45) Date of Patent: Sep. 27, 2016

(54) RETARDATION FILM WEB, CIRCULARLY POLARIZING PLATE AND ORGANIC EL PANEL

(71) Applicants: NITTO DENKO CORPORATION, Ibaraki-shi (JP); MITSUBISHI CHEMICAL CORPORATION, Chiyoda-ku (JP)

(72) Inventors: Takashi Shimizu, Osaka (JP); Kazuki Uwada, Osaka (JP); Tadashi Kojima, Osaka (JP); Nao Murakami, Osaka (JP); Tomohiko Tanaka, Fukuoka (JP); Shingo Namiki, Fukuoka (JP)

(73) Assignees: NITTO DENKO CORPORATION, Ibaraki-shi (JP); MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 14/389,576

(22) PCT Filed: Mar. 28, 2013

(86) PCT No.: PCT/JP2013/059394
§ 371 (c)(1),
(2) Date: Sep. 30, 2014

(87) PCT Pub. No.: WO2013/147091
PCT Pub. Date: Oct. 3, 2013

(65) Prior Publication Data
US 2015/0109667 A1    Apr. 23, 2015

(30) Foreign Application Priority Data

Mar. 30, 2012 (JP) ................... 2012-080628
Aug. 1, 2012 (JP) ................... 2012-171507
Mar. 19, 2013 (JP) ................... 2013-057082

(51) Int. Cl.
*G02B 5/30* (2006.01)
*C08G 64/16* (2006.01)
*H01L 51/52* (2006.01)
*G02B 1/08* (2006.01)

(52) U.S. Cl.
CPC ........... *G02B 5/305* (2013.01); *C08G 64/1608* (2013.01); *G02B 1/08* (2013.01); *G02B 5/3033* (2013.01); *G02B 5/3083* (2013.01); *H01L 51/5281* (2013.01); *Y10T 156/10* (2015.01)

(58) Field of Classification Search
CPC .. G02B 5/305; G02B 5/3033; G02B 5/3083; G02B 1/08; C08G 64/1608; H01L 51/5281
USPC .................................................. 359/489.07
See application file for complete search history.

(56) References Cited

U.S. PATENT DOCUMENTS

| | | | |
|---|---|---|---|
| 2004/0096594 A1* | 5/2004 | Takeuchi et al. | 428/1.2 |
| 2006/0093759 A1* | 5/2006 | Fukagawa | 428/1.31 |
| 2007/0134441 A1 | 6/2007 | Shutou | 428/1.3 |
| 2009/0116109 A1 | 5/2009 | Konishi et al. | |
| 2009/0117294 A1* | 5/2009 | Omatsu et al. | 428/1.31 |
| 2009/0286098 A1* | 11/2009 | Yajima et al. | 428/507 |
| 2010/0134737 A1 | 6/2010 | Kawamoto et al. | |
| 2011/0288261 A1 | 11/2011 | Motoyoshi et al. | |
| 2012/0229719 A1* | 9/2012 | Ishiguro | 349/15 |
| 2012/0308796 A1 | 12/2012 | Tanaka et al. | |
| 2013/0005939 A1 | 1/2013 | Motoyoshi et al. | |
| 2014/0268333 A1 | 9/2014 | Tanaka et al. | |
| 2014/0285888 A1 | 9/2014 | Tanaka et al. | |
| 2015/0141577 A1* | 5/2015 | Namiki et al. | 525/146 |

FOREIGN PATENT DOCUMENTS

| | | |
|---|---|---|
| CN | 1665361 | 9/2005 |
| CN | 101271227 | 9/2008 |
| CN | 102227657 | 10/2011 |
| EP | 2 354 816 A1 | 8/2011 |
| EP | 2 757 395 A1 | 7/2014 |
| JP | 2002-22944 | 1/2002 |
| JP | 2004-145305 | 5/2004 |
| JP | 2004-258508 | 9/2004 |
| JP | 2007-279091 | 10/2007 |
| JP | 3984277 | 10/2007 |
| JP | 2008-40456 | 2/2008 |

(Continued)

OTHER PUBLICATIONS

Ken-Tsung Wong et al., "Synthesis and Properties of 9,9-Diarylfluorene-Based Triaryldiamines", Organic Letters, vol. 3, No. 15, pp. 2285-2288, Jun. 30, 2001.*
International Search Report and Written Opinion of the International Searching Authority issued May 7, 2013, in PCT/JP2013/059394, filed Mar. 28, 2013.
Extended European Search Report issued Apr. 17, 2015 in Patent Application No. 13767670.6.
Office Action as received in the corresponding Chinese Patent Application No. 20138001734.0 dated Mar. 15, 2016 w/English Translation.
Office Action as received in the corresponding Taiwanese Patent Application No. 102111644 dated Aug. 1, 2016 w/English Translation.

*Primary Examiner* — Frank Font
(74) *Attorney, Agent, or Firm* — Oblon, McClelland, Maier & Neustadt, L.L.P

(57) ABSTRACT

The present invention provides a retardation film web having sufficient reversed wavelength dispersion characteristics and favorable for film lamination according to a roll-to-roll system. A retardation film web of the present invention includes a polycarbonate resin or a polyester carbonate resin, an orientation angle θ which is an angle between a slow axis and a width direction satisfies the following formula (I), and a ratio of an in-plane retardation R450 measured at a wavelength of 450 nm to an in-plane retardation R550 measured at a wavelength of 550 nm satisfies the following formula (II):

$38° \leq \theta \leq 52°$            (I)

$R450/R550 < 1$            (II).

14 Claims, 1 Drawing Sheet

(56) References Cited

FOREIGN PATENT DOCUMENTS

| | | |
|---|---|---|
| JP | 4123831 | 7/2008 |
| JP | 2012-31332 | 2/2012 |
| JP | 2012-31369 | 2/2012 |
| JP | 2012-198282 | 10/2012 |
| JP | 2013-61563 | 4/2013 |
| TW | 200530639 | 12/1993 |
| WO | 2006/041190 A1 | 4/2006 |
| WO | 2011-062163 | 5/2011 |
| WO | WO 2011/062163 A1 | 5/2011 |
| WO | 2012/017639 A1 | 2/2012 |

\* cited by examiner

- Long retardation film

- Long laminate film
- Circularly polarizing plate

* The protective film may not be included.

- Organic EL panel

RETARDATION FILM WEB, CIRCULARLY POLARIZING PLATE AND ORGANIC EL PANEL

TECHNICAL FIELD

The present invention relates to a retardation film web, a circularly polarizing plate and an organic EL panel.

BACKGROUND ART

In some thin displays such as liquid-crystal displays, a retardation film is used. The retardation film has a slow axis, and has an action to generate phase lag of the polarization component parallel to the slow axis of the light having passed through the retardation film (hereinafter this may be arbitrarily referred to as "in-plane retardation").

As combined with a polarizing film capable of producing linear polarization in the direction vertical to the absorption axis thereof, the retardation film is used for prevention of external light reflection on a display surface and for optical compensation for viewing angle enlargement. In this case, the slow axis of the retardation film and the absorption axis of the polarizing film must be so arranged as to form a predetermined angle therebetween.

In addition, the retardation film may be required to satisfy so-called reversed wavelength dispersion characteristics of such that the retardation thereof increases with the increase in the wavelength of light applied thereto. As an example of the retardation film having reversed wavelength dispersion characteristics, Patent Document 1 discloses a retardation film web formed through longitudinal monoaxial stretching, transverse monoaxial stretching, longitudinal and transverse simultaneous biaxial stretching or longitudinal and transverse successive biaxial stretching.

BACKGROUND ART DOCUMENT

Patent Document

Patent Document 1: Japanese Patent No. 3984277
Patent Document 2: Japanese Patent No. 4123831

SUMMARY OF THE INVENTION

Problems that the Invention is to Solve

In the conventional retardation film web of the type, a slow axis is formed in the direction parallel to the stretching direction. A conventional polarizing film to be combined with the retardation film has an absorption axis generally in any of the width direction and longitudinal direction.

Consequently, for example, when a conventional retardation film web and a long polarizing film are laminated in such a manner that the slow axis and the absorption axis form a predetermined angle therebetween, then at least one of these must be cut before use, and there is a problem that the material loss is great and the productivity is low. Given the situation, it has been desired to develop a technique of continuously laminating a retardation film web and a long polarizing film according to a roll-to-roll system to give a laminate film of the two.

For production according to such a roll-to-roll system, a retardation film web having a slow axis in the direction having a predetermined angle to the width direction thereof must be used. However, no one has heretofore known a retardation film web of which the slow axis forms a predetermined angle with the width direction thereof and which has sufficient reversed wavelength dispersion characteristics. For example, Patent Document 2 discloses a retardation film web produced by stretching an alicyclic structure-containing polymer resin in an oblique direction relative to the width direction thereof. However, the retardation film web could not have sufficient reversed wavelength dispersion characteristics, and therefore in case where external reflection of a display is desired to be prevented by using the film, there occurs a problem in that the display would be tinged with the reflection color. In addition, the retardation film web obtained by stretching in an oblique direction relative to the width direction thereof has another problem in that the film may have oblique wrinkles running in the stretched direction. Further, there is still another problem in that the retardation film web is often broken when the obtained film is rolled up around a roll.

The present invention has been made in consideration of the above-mentioned background, and provide a retardation film web having sufficient reversed wavelength dispersion characteristics, capable of being prevented from wrinkling and breaking owing to oblique stretching, and favorable for film lamination according to a roll-to-roll system.

Means for Solving the Problems

The present invention relates to the following [1] to [15].

[1] One aspect of the present invention is a retardation film web including a polycarbonate resin or a polyester carbonate resin, in which an orientation angle $\theta$ which is an angle between a slow axis and a width direction satisfies the following formula (I), and a ratio of an in-plane retardation R450 measured at a wavelength of 450 nm to an in-plane retardation R550 measured at a wavelength of 550 nm satisfies the following formula (II):

$$38° \leq \theta \leq 52° \tag{I}$$

$$R450/R550 < 1 \tag{II}.$$

[2] The retardation film web according to [1], in which a glass transition temperature of the polycarbonate resin or the polyester carbonate resin is 190° C. or lower.

[3] The retardation film web according to [1] or [2], in which the polycarbonate resin or the polyester carbonate resin contains a structural unit having a 9,9-diarylfluorene structure.

[4] The retardation film web according to any one of [1] to [3], in which the polycarbonate resin or the polyester carbonate resin contains a structural unit having a bonding structure represented by the following structural formula (1):

[Chem. 1]

$$\text{CH}_2\text{—CH}_2\text{—O—} \tag{1}$$

[5] The retardation film web according to [3] or [4], in which the polycarbonate resin or the polyester carbonate resin contains a structural unit derived from a dihydroxy compound represented by the following general formula (2):

[Chem. 2]

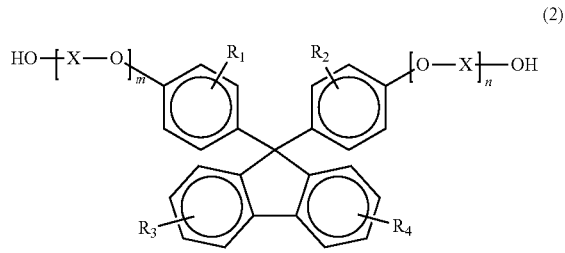

(2)

(in the above general formula (2), $R_1$ to $R_4$ each independently represent a hydrogen atom, a substituted or unsubstituted alkyl group having from 1 to 20 carbon atoms, a substituted or unsubstituted cycloalkyl group having from 6 to 20 carbon atoms, or a substituted or unsubstituted aryl group having from 6 to 20 carbon atoms, and as four substituents of the respective benzene rings, the same or different groups thereof are arranged. X represents a substituted or unsubstituted alkylene group having from 2 to carbon atoms, a substituted or unsubstituted cycloalkylene group having from 6 to 20 carbon atoms, or a substituted or unsubstituted arylene group having from 6 to 20 carbon atoms. m and n each independently indicate an integer of from 0 to 5).

[6] The retardation film web according to any one of [1] to [5], in which the polycarbonate resin or the polyester carbonate resin contains a structural unit derived from a dihydroxy compound represented by the following general formula (3):

[Chem. 3]

(3)

(in the above general formula (3), $R_5$ represents a substituted or unsubstituted alkylene group having from 2 to 10 carbon atoms; and p indicates an integer of from 2 to 100).

[7] The retardation film web according to any one of [1] to [6], in which the polycarbonate resin or the polyester carbonate resin contains a structural unit derived from a dihydroxy compound having a cyclic ether structure.

[8] The retardation film web according to [7], in which the polycarbonate resin or the polyester carbonate resin contains a structural unit derived from a dihydroxy compound represented by the following structural formula (6):

[Chem. 4]

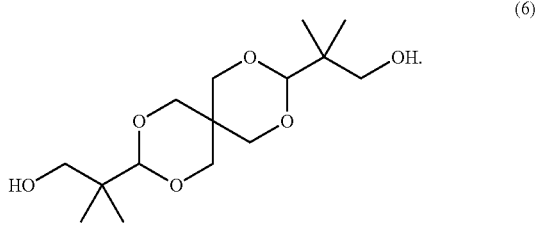 [SMILES: CC(C)(CO)C1OCC2(CO1)COC(C(C)(C)CO)OC2]

(6)

[9] The retardation film web according to [7], in which the polycarbonate resin or the polyester carbonate resin contains a structural unit derived from a dihydroxy compound represented by the following general formula (4):

[Chem. 5]

(4)

[10] The retardation film web according to any one of [1] to [9], in which the retardation film web has a thickness of 100 μm or less, and the in-plane retardation R550 thereof measured at a wavelength of 550 nm is from 100 to 160 nm.

[11] A laminate film web, wherein the retardation film web according to any one of [1] to [10] is laminated with a long polarizing film having an absorption axis in any of a longitudinal direction and a width direction thereof, in such a manner that their longitudinal directions are aligned with each other.

[12] A circularly polarizing plate obtained by cutting the laminate film web according to [11].

[13] The circularly polarizing plate according to [12], which has a thickness of 200 μm or less.

[14] An organic EL panel having the circularly polarizing plate according to [12] or [13].

[15] A method for producing a circularly polarizing plate, the method including:

a retardation film feeding step of feeding, in a longitudinal direction thereof, a retardation film web including a polycarbonate resin or a polyester carbonate resin, in which an orientation angle θ which is an angle between a slow axis and a width direction satisfies the following formula (I) and a ratio of an in-plane retardation R450 measured at a wavelength of 450 nm to an in-plane retardation R550 measured at a wavelength of 550 nm satisfies the following formula (II);

a polarizing film feeding step of feeding, in a longitudinal direction thereof, a long polarizing film having an absorption axis in any of the longitudinal direction and a width direction thereof; and a lamination step of laminating the retardation film web fed in the retardation film web feeding step and the long polarizing film fed in the polarizing film feeding step in such a manner that their longitudinal directions are aligned with each other to thereby continuously form a laminate film web:

$$38° \leq \theta \leq 52° \quad (I)$$

$$R450/R550 < 1 \quad (II).$$

ADVANTAGE OF THE INVENTION

Figure 1:
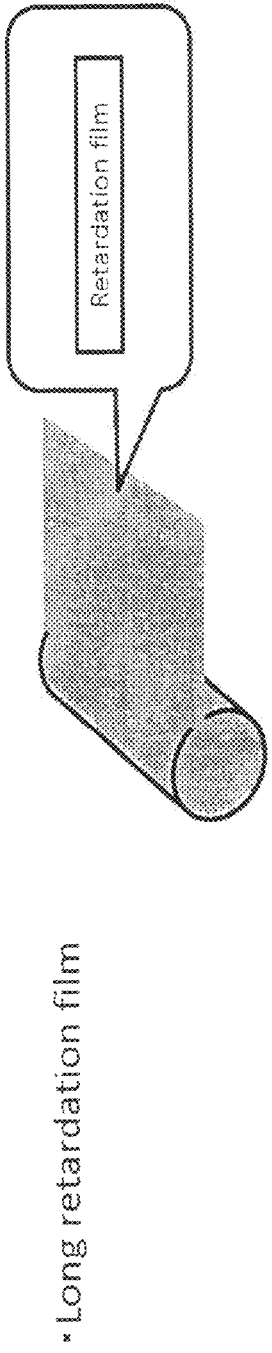
FIG. 1 shows a retardation film web.
Figure 2:
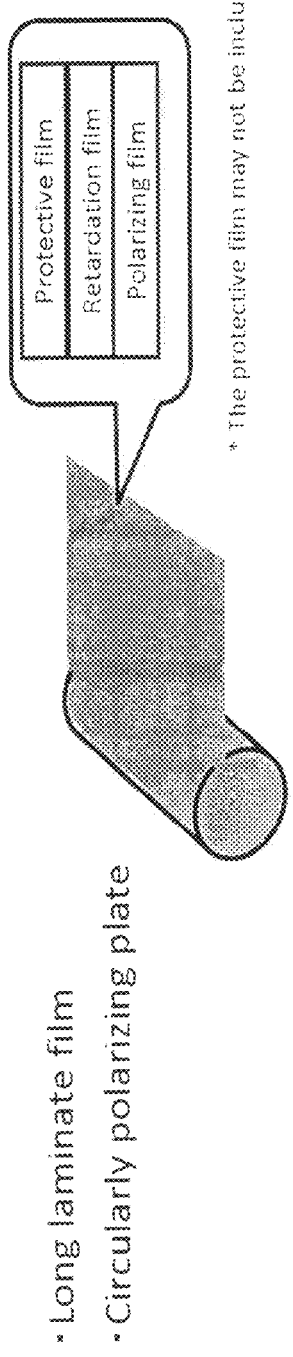
FIG. 2 shows a laminate film web and a circularly polarizing plate.
Figure 3:
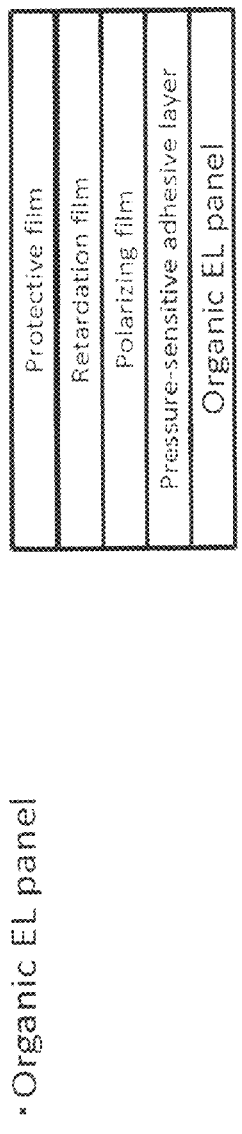
FIG. 3 shows an Organic EL panel.

The retardation film web includes a polycarbonate resin or a polyester carbonate resin. Accordingly, the retardation film web has excellent heat resistance and mechanical properties. In the present invention, the polycarbonate resin is a polymer having a structure where structural units derived from a dihydroxy compound bond to each other via a carbonate bond. In the present invention, the polyester carbonate resin is a polymer having a structure where a part of the carbonate bond in the polycarbonate resin is substituted with an ester bond structure.

The angle (orientation angle θ) between the slow axis and the width direction of the retardation film is from 38° to 52°. Here, the conventional long polarizing film to be combined with the retardation film web has an absorption axis generally in any of the width direction and the longitudinal direction thereof. Therefore, in case where the retardation film web is combined with the conventional long polarizing film, the two are laminated so that their longitudinal directions are aligned with each other, whereby the slow axis and the absorption axis of the two form an angle falling within the above-mentioned specific range. In other words, the retardation film web is so configured as to enable film lamination according to a roll-to-roll system.

In the retardation film web, the ratio of the in-plane retardation R450 measured at a wavelength of 450 nm to the in-plane retardation R550 measured at a wavelength of 550 nm (R450/R550) is less than 1.0, preferably from 0.75 to 0.97, more preferably from 0.80 to 0.95, even more preferably from 0.86 to 0.93. When the in-plane retardation ratio falls within the specific range, the film can have ideal retardation characteristics at each wavelength in a visible region. In other words, for example, in case where the retardation film web is stuck to a polarizing plate to give a circularly polarizing plate to be used, there can be produced a circularly polarizing plate capable of providing circular polarization at each wavelength in a visible region. As a result, a circularly polarizing plate and a display device that are colored little and are neutral can be realized. On the other hand, in case where the in-plane retardation ratio falls outside the above-mentioned specific range, circular polarization cannot be attained at least in some wavelength regions, and there would occur some coloring problem in polarizing plates and display devices.

According to the production method for a circularly polarizing plate mentioned above, the above-mentioned laminate film web in which the slow axis of the retardation film web and the absorption axis of the long polarizing film are aligned at an angle falling within the above-mentioned specific range can be produced continuously. Consequently, the productivity of the circularly polarizing plate can be thereby improved and the material loss of the retardation film web can be reduced.

MODE FOR CARRYING OUT THE INVENTION

The term "long" of the long retardation film, the long polarizing film and the long lamination film (retardation film web, polarizing film web, and lamination film web) means that the dimension in the longitudinal direction of the film is sufficiently larger than that of the width direction thereof, and substantially means such that the film can be wound up in the longitudinal direction to give a coiled film. More concretely, the term means that the dimension of the longitudinal direction of the film is larger by 10 times or more than the dimension of the width direction thereof.

In this description, the orientation angle θ shows conveniently the value measured in the counterclockwise direction based on the width direction of the retardation film web, but the same shall apply to the case where the value is measured in the clockwise direction of the film. Specifically, in any case where the orientation angle θ is measured in a clockwise direction or in a counterclockwise direction, the retardation film web can exhibit the above-mentioned advantageous effects so far as the absolute value of the orientation angle θ falls within the above-mentioned specific range.

The retardation film web of the present invention includes a polycarbonate resin or a polyester carbonate resin, of which the angle between the slow axis and the width direction, or that is, the orientation angle θ thereof satisfies the following formula (I), and of which the ratio of the in-plane retardation R450 measured at a wavelength of 450 nm to the in-plane retardation R550 measured at a wavelength of 550 nm satisfies the following formula (II):

$$38°≤θ≤52°$$ (I)

$$R450/R550<1$$ (II)

Preferably, in the retardation film web, the glass transition temperature of the polycarbonate resin or the polyester carbonate resin is 190° C. or lower. When the glass transition temperature of the polycarbonate resin or the polyester carbonate resin falls within the range, then the stretching treatment for slow axis formation is easy. However, when the glass transition temperature is higher than 190° C., then the shape stability in film formation would worsen, and the film transparency would be lost. Consequently, the upper limit of the glass transition temperature is preferably 190° C. or lower, more preferably 170° C. or lower, even more preferably 160° C. or lower, still more preferably 150° C. or lower, further more preferably 145° C. or lower, especially preferably 142° C. or lower. On the other hand, when the glass transition temperature is too low, then the heat resistance of the film would worsen so that there may occur dimensional change after film formation, and in addition, when the retardation film of the type is stuck to a polarizing plate, then it would cause image quality degradation. From these viewpoints, the lower limit of the glass transition temperature is preferably 100° C. or higher, more preferably 110° C. or higher, even more preferably 115° C. or higher, still more preferably 118° C. or higher, further more preferably 120° C. or higher.

The polycarbonate resin or the polyester carbonate resin may contain a structural unit having a 9,9-diarylfluorene structure. In this case, the polycarbonate resin or the polyester carbonate resin can readily satisfy the above formula (II) for the in-plane retardation ratio, and accordingly, the resin of the type is favorable as a material for the retardation film web.

Here, the 9,9-diarylfluorene structure may be joined to the polycarbonate resin or the polyester carbonate resin in any morphology therein. For example, the 9,9-diarylfluorene structure may directly bond to the carbonyl group or may bond thereto via a linking group. As a preferred linking morphology between the 9,9-diarylfluorene structure and the carbonyl group, there is mentioned a morphology where the aryl group contained in the 9,9-diarylfluorene structure bonds to the carbonyl group via a linking group therebetween. The linking group of the type includes an alkylene group and an oxyalkylene group, and preferred is an alkylene group having from 1 to 12 carbon atoms or an oxyalkylene group having from 1 to 12 carbon atoms.

The aryl group bonding to the 9,9-diarylfluorene structure may be any one derived from an aromatic ring, and includes, for example, a benzene ring, a condensed ring of multiple benzene rings, a hetero atom-containing ring such as pyridine, etc. Above all, preferred is an aromatic cyclic group in which the number of the constituent rings is 4 or less. Especially preferred is a phenyl group. The polycarbonate resin or the polyester carbonate resin that contains a structural unit having a 9,9-diarylfluorene structure can be produced by using, as the starting material for the resin, a dihydroxy compound having a 9,9-diarylfluorene structure. Specific examples of the 9,9-diarylfluorene structure-containing dihydroxy compound are described below as dihydroxy compounds (A).

The aryl group bonding to the 9,9-diarylfluorene structure may have a substituent. The substituent is preferably a substituted or unsubstituted alkyl group having from 1 to 20 carbon atoms, a substituted or unsubstituted cycloalkyl group having from 3 to 20 carbon atoms, or a substituted or unsubstituted aryl group having from 6 to 20 carbon atoms, and is more preferably an alkyl group having from 1 to 20 carbon atoms, a cycloalkyl group having from 3 to 20 carbon atoms or an aryl group having from 6 to 20 carbon atoms.

The polycarbonate resin or the polyester carbonate resin may contain a structural unit having a bonding structure represented by the following structural formula (1):

[Chem. 6]

$$\text{CH}_2\text{—CH}_2\text{—O—} \tag{1}$$

In this case, the polycarbonate resin or the polyester carbonate resin may be given flexibility. Accordingly, during stretching treatment, the polycarbonate resin or the polyester carbonate resin is hardly broken, and the retardation film web to be obtained can be thereby given toughness.

The bonding structure represented by the above-mentioned structural formula (1) may be introduced into the polycarbonate resin or the polyester carbonate resin from any origin. For example, the structure may be introduced thereinto as a linking group for linking the aryl group of the 9,9-diarylfluorene structure to the polycarbonate resin or the polyester carbonate resin, or a dihydroxy compound having the bonding structure represented by the structural formula (1) may be copolymerized with the resin. In case where the bonding structure represented by the structural formula (1) is introduced as a linking group for linking the 9,9-diarylfluorene structure in the polycarbonate resin or the polyester carbonate resin, used is one having a structure represented by the structural formula (1) as the substituent of the aryl group, among the dihydroxy compound having a 9,9-diarylfluorene structure, as the material for the polycarbonate resin or the polyester carbonate resin in the present invention.

As the dihydroxy compound having a structural part represented by the structural formula (1), there are mentioned linear aliphatic dihydroxy compound having a structural part represented by the structural formula (1), a dihydroxy compound having an alicyclic hydrocarbon group having a structural part represented by the structural formula (1), and an oxyalkylene glycol having a structural part represented by the structural formula (1) and the like, in addition to the dihydroxy compound having a 9,9-diarylfluorene structure and having a structure represented by the structural formula (1) as the substituent of the aryl group mentioned above. Specific examples of these copolymerization components are described hereinunder.

The polycarbonate resin or the polyester carbonate resin may contain a structural unit derived from a dihydroxy compound represented by the following general formula (2):

[Chem. 7]

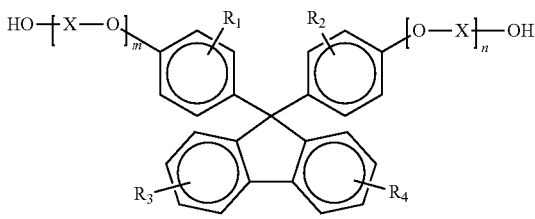

(2)

(in the above general formula (2), $R_1$ to $R_4$ each independently represent a hydrogen atom, a substituted or unsubstituted alkyl group having from 1 to 20 carbon atoms, a substituted or unsubstituted cycloalkyl group having from 6 to 20 carbon atoms, or a substituted or unsubstituted aryl group having from 6 to 20 carbon atoms, and as the four substituents of the respective benzene rings, the same or different groups thereof are arranged. X represents a substituted or unsubstituted alkylene group having from 2 to 10 carbon atoms, a substituted or unsubstituted cycloalkylene group having from 6 to 20 carbon atoms, or a substituted or unsubstituted arylene group having from 6 to 20 carbon atoms. m and n each independently indicate an integer of from 0 to 5.)

In this case, the dihydroxy compound represented by the above general formula (2) has a 9,9-diarylfluorene structure, and therefore, as described above, it is easy to produce the polycarbonate resin or the polyester carbonate resin that provides the in-plane retardation ratio satisfying the above formula (II). In addition, the polycarbonate resin or the polyester carbonate resin obtained using the dihydroxy compound represented by the above general formula (2) is excellent in heat resistance, mechanical strength, optical properties and polymerization reactivity.

The polycarbonate resin or the polyester carbonate resin may contain a structural unit derived from a dihydroxy compound represented by the following formula (3):

[Chem. 8]

$$\text{H—(O—R}_5)_p\text{—OH} \tag{3}$$

(in the above general formula (3), $R_5$ represents a substituted or unsubstituted alkylene group having from 2 to 10 carbon atoms; and p indicates an integer of from 2 to 100.)

In this case, the polycarbonate resin or the polyester carbonate resin can be given flexibility. Accordingly, during stretching treatment, the polycarbonate resin or the polyester carbonate resin is hardly broken, and the retardation film web to be obtained can be thereby given toughness.

Concretely, as the dihydroxy compound represented by the above general formula (3), diethylene glycol, triethylene glycol, polyethylene glycol having a molecular weight of from 150 to 4000 or the like may be mentioned.

The polycarbonate resin or the polyester carbonate resin may contain a structural unit derived from a cyclic ether structure-containing dihydroxy compound. In this case, the heat resistance and the mechanical properties of the retardation film web can be further more improved.

Here, as the cyclic ether structure-containing dihydroxy compound, usable is a dihydroxy compound having a cyclic structure that contains an oxygen atom incorporated through ether bonding, for example, a furan skeleton, a pyran skeleton, a dioxane skeleton, a dioxolane skeleton or the like. In the dihydroxy compound of the type, the number of the oxygen atoms incorporated in the ether ring may be one or more in the dihydroxy compound and is more preferably two or more. The number of the ether rings may also be one or more, and is more preferably two or more. Specific examples of the dihydroxy compound having such a cyclic ether structure are described as dihydroxy compounds (C) hereinunder.

The polycarbonate resin or the polyester carbonate resin may contain a structural unit derived from a dihydroxy compound represented by the following structural formula (6). In this case, the retardation film having high transparency and a low photoelastic coefficient and having heat resistance can be obtained with ease.

[Chem. 9]

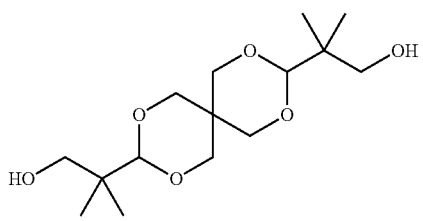

(6)

The polycarbonate resin or the polyester carbonate resin may contain a structural unit derived from a dihydroxy compound represented by the following general formula (4). In this case, the retardation film having high transparency and a low photoelastic coefficient and having heat resistance can be obtained with ease.

[Chem. 10]

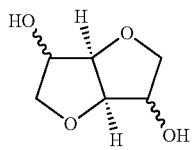

(4)

The dihydroxy compound represented by the structural formula (4) includes, for example, isosorbide, isomannide and isoidet having a relation of stereoisomers. One alone or two or more of these may be used here either singly or as combined. Of those dihydroxy compounds, most preferred is isosorbide that can be obtained through dehydrating condensation of sorbitol capable of being produced from various easily-available starches existing much as natural resources, from the viewpoint of easy availability and easy producibility thereof and of the optical properties and the moldability.

Preferably, the thickness of the retardation film web is 100 μm or less, and the in-plane retardation R550 thereof, measured at a wavelength of 550 nm, is from 100 to 160 nm. In this case, it is easy to obtain the retardation film web having sufficient retardation characteristics and favorable for instruments that require precision, thinness and homogeneousness. When the thickness is larger than 100 μm, then the amount of the material to be used may increase and the uniformity control would be difficult. The thickness of the retardation film web is preferably 80 μm or less, more preferably 70 μm or less. On the other hand, when the retardation film web is too thin, then the film would be difficult to handle and would be wrinkled or broken during production. Accordingly, the lower limit of the thickness of the retardation film web is preferably 10 μm or more, more preferably 20 μm or more.

When the in-plane retardation R550 measured at a wavelength of 550 nm is more than the above-mentioned specific range, then the retardation characteristics would be insufficient. Regarding the preferred range thereof, the in-plane retardation R550 of the retardation film web is preferably from 120 to 150 nm.

The retardation film web can be used for producing a laminate film web which includes the retardation film web and a long polarizing film having an absorption axis in any of the longitudinal direction and the width direction, and in which the two films are laminated in such a manner that their longitudinal directions are aligned with each other. The retardation film web is, as described above, formed in such a manner that the slow axis thereof forms an angle falling within the above-mentioned specific range (orientation angle θ) relative to the width direction thereof. Accordingly, by laminating the long polarizing film and the retardation film web with their longitudinal directions kept aligned, the material loss can be reduced and it is easy to form the above-mentioned laminate film web having optical properties capable of functioning as a circularly polarizing plate.

The retardation film web can be favorably used for production of a circularly polarizing plate obtained by cutting the above-mentioned laminate film web. The laminate film web has, as mentioned above, optical characteristics capable of functioning as a circularly polarizing plate. Accordingly, by cutting the laminate film web into a suitable size, it is easy to form a circularly polarizing plate.

Preferably, the circularly polarizing plate has a thickness of 200 μm or less. In this case, it is easy to obtain a circularly polarizing plate favorable for instruments that require precision, thinness and homogeneousness.

The circularly polarizing plate can be favorable used for organic EL panels. As described above, the circularly polarizing plate has sufficient optical characteristics and is so configured as to be favorably used for instruments that require precision, thinness and homogeneousness. These instruments include, for example, liquid-crystal panels for use in liquid-crystal displays, and organic EL panels for use in organic EL displays, etc. In particular, an organic EL panel has a metal layer capable of readily reflecting external light, and therefore often faces a problem of external light reflection and background scene reflection thereon. For preventing such external light reflection and others, it is effective to provide the circularly polarizing plate on a light-emitting face.

As an index of the characteristics for protecting the organic EL panel from such external light reflection and the like, for example, there may be employed reflectance and reflection color. The reflectance has an influence on the lightness of the display color in a black display state, or that is, in the light-off state of an organic EL device; and the panel having a low reflectance gives a sharper black and the display visibility is thereby improved. In case where the reflectance is too high, the lightness of the display color could be large owing to external light reflection, and in such a case, therefore, the bright room contrast would lower and the visibility would also lower.

The reflection color has an influence on the display color at the time of black level of display, and when the display color is nearer to a colorless state, there can be obtained a sharp black. In case where the reflected light is in a colored state, black display would be impossible. For reflection color evaluation, for example, there can be employed chromatic coordinate values in a u'v' chromaticity diagram, an xy chromaticity diagram, etc. In other words, the colorless chromatic coordinates in a u'v' chromaticity diagram or an xy chromaticity diagram are (u',v')=(0.210, 0.471), (x,y)=(0.33, 0.33); and when the reflection color is nearer to the value, then there can be obtained a sharp black.

Next described is a production method for the retardation film web. The production method for the retardation film web is not limited to the embodiments described below, and the film can be produced according to various modifications.
<Starting Material for Polycarbonate Resin or Polyester Carbonate Resin>

As the starting material for the polycarbonate resin or the polyester carbonate resin, for example, there can be used a fluorene structure-containing dihydroxy compound (A), and a dihydroxy compound which does not contain a fluorene structure and which differs from (A) (hereinafter this may be referred to as other dihydroxy compound).
Dihydroxy Compound (A)

As the dihydroxy compound (A), usable here is a dihydroxy compound having a fluorene structure (fluorene-type dihydroxy compound). Of the fluorene-type dihydroxy compound, preferred is use of a dihydroxy compound having a 9,9-diarylfluorene structure in the molecular structure thereof, and more preferred is a dihydroxy compound represented by the following general formula (2):

[Chem. 11]

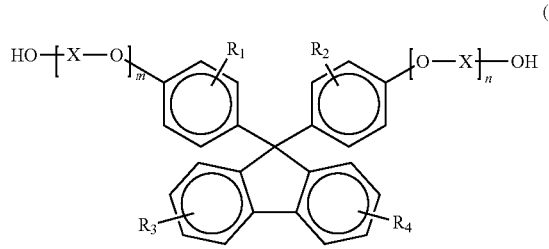

(2)

(in the above general formula (2), $R_1$ to $R_4$ each independently represent a hydrogen atom, a substituted or unsubstituted alkyl group having from 1 to 20 carbon atoms, a substituted or unsubstituted cycloalkyl group having from 6 to 20 carbon atoms, or a substituted or unsubstituted aryl group having from 6 to 20 carbon atoms, and as the four substituents of the respective benzene rings, the same or different groups thereof are arranged. X represents a substituted or unsubstituted alkylene group having from 2 to 10 carbon atoms, a substituted or unsubstituted cycloalkylene group having from 6 to 20 carbon atoms, or a substituted or unsubstituted arylene group having from 6 to 20 carbon atoms. m and n each independently indicate an integer of from 0 to 5).

Of the dihydroxy compound (A) represented by the general formula (2), preferred are those where $R_1$ to $R_4$ each independently represent a hydrogen atom, or an alkyl group having from 1 to 6 carbon atoms that is unsubstituted or substituted with an ester group, an ether group, a carboxylic acid, an amide group or a halogen, and more preferred are those where the substituents each are a hydrogen atom or an alkyl group having from 1 to 6 carbon atoms. X is preferably an alkylene group having from 2 to 10 carbon atoms that is unsubstituted or substituted with an ester group, an ether group, a carboxylic acid, an amide group or a halogen, or a cycloalkylene group having from 6 to 20 carbon atoms that is unsubstituted or substituted with an ester group, an ether group, a carboxylic acid, an amide group or a halogen, or an arylene group having from 6 to 20 carbon atoms that is unsubstituted or substituted with an ester group, an ether group, a carboxylic acid, an amide group or a halogen, and is more preferably an alkylene group having from 2 to 6 carbon atoms. Preferably, m and n each are independently an integer of from 0 to 2, more preferably 0 or 1.

The dihydroxy compound (A) of the type includes, for example, 9,9-bis(4-hydroxyphenyl)fluorene, 9,9-bis(4-hydroxy-2-methylphenyl)fluorene, 9,9-bis(4-hydroxy-3-methylphenyl)fluorene, 9,9-bis(4-hydroxy-3-ethylphenyl)fluorene, 9,9-bis(4-hydroxy-3-n-propylphenyl)fluorene, 9,9-bis(4-hydroxy-3-isopropylphenyl)fluorene, 9,9-bis(4-hydroxy-3-n-butylphenyl)fluorene, 9,9-bis(4-hydroxy-3-sec-butylphenyl)fluorene, 9,9-bis(4-hydroxy-3-tert-propylphenyl)fluorene, 9,9-bis(4-hydroxy-3-cyclohexylphenyl)fluorene, 9,9-bis(4-hydroxy-3-phenylphenyl)fluorine, 9,9-bis(4-(2-hydroxyethoxy)phenyl)fluorene, 9,9-bis(4-(2-hydroxypropoxy)phenyl)fluorene, 9,9-bis(4-(2-hydroxyethoxy)-3-methylphenyl)fluorene, 9,9-bis(4-(2-hydroxypropoxy)-3-methylphenyl)fluorene, 9,9-bis(4-(2-hydroxyethoxy)-3-isopropylphenyl)fluorene, 9,9-bis(4-(2-hydroxyethoxy)-3-isobutylphenyl)fluorene, 9,9-bis(4-(2-hydroxyethoxy)-3-tert-butylphenyl)fluorene, 9,9-bis(4-(2-hydroxyethoxy)-3-cyclohexylphenyl)fluorene, 9,9-bis(4-(2-hydroxyethoxy)-3-phenylphenyl)fluorene, 9,9-bis(4-(2-hydroxyethoxy)-3,5-dimethylphenyl)fluorene, 9,9-bis(4-(2-hydroxyethoxy)-3-tert-butyl-6-methylphenyl)fluorene, and 9,9-bis(4-(3-hydroxy-2,2-dimethylpropoxy)phenyl)fluorene. As the dihydroxy compound (A), preferred are 9,9-bis(4-(2-hydroxyethoxy)phenyl)fluorene and 9,9-bis(4-hydroxy-3-methylphenyl)fluorene, from the viewpoint of the optical properties, the heat resistance, the mechanical properties and the availability thereof and of the easiness in producing them. From the viewpoint of the ability thereof to impart toughness to the retardation film, especially preferred is 9,9-bis(4-(2-hydroxyethoxy)phenyl)fluorene.
Other Dihydroxy Compound The other dihydroxy compound may be any dihydroxy compound that differs from the dihydroxy compound (A), and not contradictory to the gist of the present invention, usable here is any and every dihydroxy compound that can be generally used as the monomer unit of ordinary polycarbonate resins or polyester polycarbonate resins. More concretely, the other dihydroxy compound usable here includes aromatic bisphenols. The aromatic bisphenols include, for example, 2,2-bis(4-hydroxyphenyl)propane, 2,2-bis(3-methyl-4-4-hydroxyphenyl)propane, 2,2-bis(4-hydroxy-3,5-dimethylphenyl)propane, 2,2-bis(4-hydroxy-3,5-diethylphenyl)propane, 2,2-bis(4-hydroxy-(3-phenyl)phenyl)propane, 2,2-bis(4-hydroxy-(3,5-diphenyl)phenyl)propane, 1,1-bis(4-hydroxyphenyl)decane, 1,1-bis(4-hydroxyphenyl)-2-ethylhexane, 1,3-bis[2-(4-hydroxyphenyl)-2-propyl]benzene, 2,2-bis(4-hydroxy-3,5-dibromophenyl)propane, bis(4-hydroxyphenyl)methane, 1,1-bis(4-hydroxyphenyl)ethane, 2,2-bis(4-hydroxyphenyl)butane, 2,2-bis(4-hydroxyphenyl)pentane, 3,3-bis(4-hydroxyphenyl)pentane, 1,1-bis(4-hydroxyphenyl)-1-phenylethane, bis(4-hydroxyphenyl)diphenylmethane, 2,4'-dihydroxy-diphenylmethane, bis(4-hydroxy-3-nitrophenyl)methane, 3,3-bis(4-hydroxyphenyl)pentane, 1,3-bis(2-(4-hydroxyphenyl)-2-propyl)benzene, 1,4-bis(2-(4-hydroxyphenyl)-2-propyl)benzene, 2,2-bis(4-hydroxyphenyl)hexafluoropropane, 1,1-bis(4-hydroxyphenyl)cyclohexane, 1,1-bis(4-hydroxyphenyl)-2-ethylhexane, 1,1-bis(4-hydroxyphenyl)decane, 2,2-bis(4-hydroxyphenyl)octane, 2,2-bis(4-hydroxyphenyl)nonane, 2,2-bis(4-hydroxyphenyl)decane, bis(4-hydroxyphenyl) sulfone, 2,4'-dihydroxydiphenyl sulfone, bis(4-hydroxyphenyl) sulfide, bis(4-hydroxy-3-methylphenyl) sulfide, bis(4-hydroxyphenyl) disulfide, 4,4'-dihydroxydiphenyl ether, and 4,4'-dihydroxy-3,3'-dichlorodiphenyl ether. Above all, preferred are 2,2-bis(4-hydroxyphenyl)propane, 1,1-bis(4-hydroxyphenyl)-2-ethylhexane and 1,1-bis(4-hydroxyphenyl)decane, from the viewpoint of the handleability and the availability thereof and of the easiness in controlling the resin so as to have a glass transition temperature suitable for melt film formation; and especially preferred is 2,2-bis(4-hydroxyphenyl)propane.

As the other dihydroxy compound, there are further mentioned linear aliphatic hydrocarbon structure-containing dihydroxy compounds, alkyl-branched aliphatic hydrocarbon structure-containing dihydroxy compounds, and alicyclic hydrocarbon structure-containing dihydroxy compounds such as dihydroxy compounds derived from terpene compounds such as 1,2-cyclohexanediol, 1,4-cyclohexanediol, limonene or the like, in addition to the above-mentioned aromatic bisphenols.

Above all, especially preferred are dihydroxy compounds having a bonding structure represented by the following structural formula (5) (hereinafter these may be referred to as dihydroxy compounds (B)). Concretely, there are mentioned primary alcohol structure-containing dihydroxy compounds, and dihydroxy compounds containing an ether bond in the molecule thereof. However, from the viewpoint of the relationship with the dihydroxy compound (C) to be mentioned below, the dihydroxy compound (B) does not contain a dihydroxy compound having a cyclic ether structure.

Using the dihydroxy compound of the type makes it possible to control the heat resistance of the polycarbonate resin or the polyester carbonate resin to fall within a suitable range and makes it possible to improve the mechanical properties such as the tensile elongation and the tear strength of the resin.

[Chem. 12]

$$—CH_2—O— \quad (5)$$

The primary alcohol structure-containing dihydroxy compound includes, for example, linear aliphatic hydrocarbon dihydroxy compounds such as ethylene glycol, 1,3-propanediol, 1,2-propanediol, 1,4-butanediol, 1,3-butanediol, 1,2-butanediol, 1,5-heptanediol, 1,6-hexanediol, 1,10-decanediol, 1,12-dodecanediol, etc.; alkyl-branched aliphatic hydrocarbon dihydroxy compounds such as neopentyl glycol, hexylene glycol, etc.; and alicyclic hydrocarbon dihydroxy compounds such as 1,2-cyclohexanediol, 1,2-cyclohexanedimethanol, 1,3-cyclohexanedimethanol, 1,4-cyclohexanedimethanol, tricyclodecanedimethanol, pentacyclopentadecanedimethanol, 2,6-decalindimethanol, 1,5-decalindimethanol, 2,3-decalindimethanol, 2,3-norbornanedimethanol, 2,5-norbornanedimethanol, 1,3-adamantanedimethanol, etc.

The dihydroxy compound having an ether bond in the molecule thereof includes, oxyalkylene glycols represented by the following general formula (3), and dihydroxy compounds containing, in the main chain thereof, an ether group bonding to an aromatic group. Preferably, the hydroxy groups of these dihydroxy compounds have a primary alcohol structure.

[Chem. 13]

$$H—(O—R_5)_p—OH \quad (3)$$

(In the above general formula (3), $R_5$ represents a substituted or unsubstituted alkylene group having from 2 to 10 carbon atoms; and p indicates an integer of from 2 to 100.)

The above-mentioned oxyalkylene glycols include diethylene glycol, triethylene glycol, tetraethylene glycol, polyethylene glycol, polypropylene glycol, polytetramethylene glycol, etc.

The dihydroxy compounds containing, in the main chain thereof, an ether group bonding to an aromatic group include 2,2-bis(4-(2-hydroxyethoxy)phenyl)propane, 2,2-bis(4-(2-hydroxypropoxy)phenyl)propane, 1,3-bis(2-hydroxyethoxy)benzene, 4,4'-bis(2-hydroxyethoxy)biphenyl, bis(4-(2-hydroxyethoxy)phenyl) sulfone, etc.

One alone or two or more of the above-mentioned dihydroxy compounds may be used here either singly or as combined in accordance with the necessary performance of the polycarbonate resin to be obtained.

As the other dihydroxy compound, preferably used here is a dihydroxy compound which does not contain an aromatic ring structure in the molecular structure thereof, from the viewpoint of the optical properties such as the photoelastic coefficient of the polycarbonate resin or the polyester carbonate resin. As those expected to exhibit an effect of improving mechanical properties, preferred is use of a dihydroxy compound which, when used alone, can make the polycarbonate resin or the polyester carbonate resin to be obtained have a glass transition temperature of 90° C. or lower. From this viewpoint, as the other dihydroxy compound, preferred is use of a primary alcohol structure-containing aliphatic hydrocarbon dihydroxy compound, a primary alcohol structure-containing alicyclic hydrocarbon dihydroxy compound, or an oxyalkylene glycol represented by the general formula (3), among the above-mentioned dihydroxy compounds (B). Specifically, of the above-mentioned dihydroxy compounds (B), preferred is use of a linear aliphatic hydrocarbon dihydroxy compound having from 3 to 8 carbon atoms and having a primary alcohol structure at both ends thereof, such as 1,3-propanediol, 1,4-butanediol, 1,5-heptanediol, 1,6-hexanediol, etc.; an alicyclic dihydroxy compound having a primary alcohol structure at both ends thereof, such as 1,2-cyclohexanedimethanol, 1,3-cyclohexanedimethanol, 1,4-cyclohexanedimethanol, tricyclodecanedimethanol, etc.; a dihydroxy compound (B) having a bonding structure represented by the structural formula (3), such as diethylene glycol, triethylene glycol, polyethylene glycol, etc. Above all, more preferred is use of 1,6-hexanediol, 1,4-cyclohexanedimethanol, diethylene glycol or polyethylene glycol. As the polyethylene glycol, preferred is use of one having a number-average molecular weight of from 150 to 4000, and more preferred is one having a number-average molecular weight of from 400 to 2000.

Combined use of the dihydroxy compound (B) and the dihydroxy compound (A) provides an effect of improving the flexibility of the polycarbonate resin or the polyester carbonate resin, improving the heat resistance thereof, and improving the melt workability and the moldability thereof.

The proportion of the structural unit derived from the dihydroxy compound (B) is preferably 40 mol % or less relative to the molar number of the structural units derived from all the dihydroxy compounds, more preferably 30 mol % or less, even more preferably 25 mol % or less. When the content ratio of the structural unit derived from the dihydroxy compound (B) is too large, then it may lower the heat resistance of the resin. On the other hand, when the content of the dihydroxy compound (B) is too small, then the resin could hardly exhibit the above-mentioned advantageous effects. Accordingly, the content of the dihydroxy compound (B) is preferably 1 mol % or more, more preferably 3 mol % or more, even more preferably 5 mol % or more. In case where the dihydroxy compound (B) is a polyoxyalkylene glycol, the proportion of the structural unit derived from the dihydroxy compound (B) is preferably 4 mol % or less relative to the molar number of the structural units derived from all the dihydroxy compounds, more preferably 3 mol % or less, even more preferably 2 mol % or less. When the content ratio of the structural unit derived from the polyoxyalkylene glycol is too large, then it may lower the heat resistance of the resin. On the other hand, when the content of the polyoxyalkylene glycol is too small, then the resin could hardly exhibit the above-mentioned advantageous effects. Accordingly, the content of the polyoxyalkylene glycol is preferably 0.1 mol % or more, more preferably 0.3 mol % or more, even more preferably 0.5 mol % or more.

As the other dihydroxy compound, also usable here is a dihydroxy compound (C) that differs from aromatic bisphenols and dihydroxy compounds (B). Here, the dihydroxy compound (C) may be used in place of aromatic bisphenols and dihydroxy compounds (B), or may be used as combined with at least one other dihydroxy compound selected from aromatic bisphenols and dihydroxy compounds (B).

As the dihydroxy compound (C), preferred is use of one or more dihydroxy compounds containing a cyclic ether structure, in order to impart optical characteristics such as suitable birefringence and low photoelastic coefficient and other characteristics such as heat resistance and mechanical strength to the polycarbonate resin or the polyester carbonate resin. The cyclic ether structure means a cyclic structure containing an oxygen atom incorporated through ether bonding. Above all, preferred are those in which the carbons constituting the cyclic chain are aliphatic carbons alone; more preferred are those having multiple ether groups; even more preferred are those having multiple cyclic ether structures; and still more preferred are those having two cyclic ether structures.

Specific examples of the dihydroxy compound (C) include a hydroxy compound represented by the following structural formula (4), a spiroglycol represented by the following structural formula (6) and a dihydroxy compound represented by the following structural formula (7).

The dihydroxy compound represented by the following structural formula (6) or structural formula (7) has a primary alcohol structure but has a cyclic ether structure, and therefore differs from the above-mentioned dihydroxy compounds (B).

[Chem. 14]

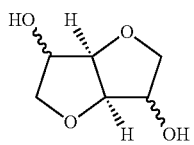

(4)

[Chem. 15]

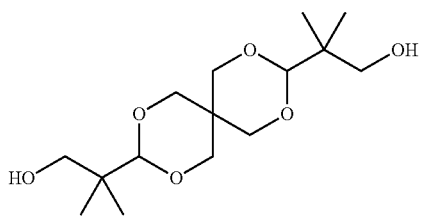

(6)

[Chem. 16]

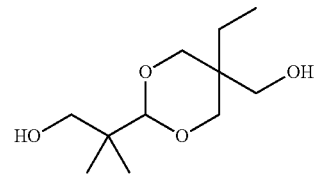

(7)

Here, the dihydroxy compound represented by the above-mentioned structural formula (4) includes isosorbide (hereinafter this may be abbreviated as "ISB"), isomannide and isoidet that are in a relationship of stereoisomers. One alone or two or more of these may be used here either singly or as combined.

Of those dihydroxy compounds (C), more preferred are anhydrous sugar alcohols which are sugar-derived hydroxy compounds having two cyclic ether structures, such as the dihydroxy compound represented by the structural formula (4), and dihydroxy compounds having two cyclic ether structures such as spiroglycol represented by the structural formula (6), from the viewpoint of the availability, the handleability and the reactivity in polymerization thereof and from the viewpoint of the heat resistance and the mechanical properties of the obtained polycarbonate resin; and most preferred are anhydrous sugar alcohols which are sugar-derived hydroxy compounds having two cyclic ether structures, such as the dihydroxy compound represented by the structural formula (4), from the viewpoint of the availability and the easy producibility thereof and also of the light resistance, the optical properties, the moldability, the heat resistance and the carbon neutrality thereof.

One alone or two or more of these dihydroxy compounds (C) may be used here either singly or as combined, in accordance with the necessary performance of the polycarbonate resin to be obtained. For example, in combined use with the above-mentioned dihydroxy compound (A), the molar ratio of the dihydroxy compound (A) to the dihydroxy compound (C), (A)/(C) is preferably from 10/90 to 70/30, for the purpose of obtaining desired optical properties and for securing well-balanced physical properties such as heat resistance and mechanical strength, more preferably from 20/80 to 60/40.

As the polycarbonate resin or the polyester carbonate resin in the present invention, usable is a polyester carbonate resin prepared by substituting a part of the carbonate bonds in the polycarbonate resin with an ester bond structure. The dicarboxylic acid compound forming the ester bond structure includes aromatic dicarboxylic acids such as terephthalic acid, phthalic acid, isophthalic acid, 4,4'-diphenyldicarboxylic acid, 4,4'-diphenylether-dicarboxylic acid, 4,4'-benzophenonedicarboxylic acid, 4,4'-diphenoxyethanedicarboxylic acid, 4,4'-diphenylsulfonedicarboxylic acid, 2,6-naphthalenedicarboxylic acid, etc.; alicyclic dicarboxylic acids such as 1,2-cyclohexanedicarboxylic acid, 1,3-cyclohexanedicarboxylic acid, 1,4-cyclohexanedicarboxylic acid, etc.; aliphatic dicarboxylic acids such as malonic acid, succinic acid, glutaric acid, adipic acid, pimelic acid, suberic acid, azelaic acid, sebacic acid, etc. From the viewpoint of the heat resistance and the heat stability of the obtained polymer, preferred are aromatic dicarboxylic acids; and especially from the viewpoint of the handleability and the availability thereof, more preferred are terephthalic acid and isophthalic acid, and even more preferred is terephthalic acid. These dicarboxylic acid components could be the starting materials for the polyester carbonate resin directly as they are; however, depending on the production method, also usable as the starting materials here are dicarboxylic acid derivatives such as dicarboxylate esters of methyl ester forms, phenyl ester forms and the like, and also dicarboxylic acid halides, etc.

In the polyester carbonate resin, the content ratio of the structural unit derived from the dicarboxylic acid used as the starting material is preferably 45 mol % or less relative to the total, 100 mol %, of the structural units derived from all dihydroxy compounds and the structural units derived from all carboxylic acid compounds, and is more preferably 40 mol % or less. When the content ratio of the structural unit derived from the dicarboxylic acid is larger than 45 mol %, then the polymerizability may lower and the polymerization could not go on to give a desired molecular weight.

From the viewpoint of heat resistance and heat stability, introduction of an aromatic dicarboxylic acid structure may tend to increase the photoelastic coefficient of the resin, and there is a possibility that, when the film is worked into a circularly polarizing plate, the optical properties of the resulting plate may be worsened. Consequently, it is desirable that the retardation film web of the present invention includes a polycarbonate resin.

A preferred example of the polycarbonate resin is a polycarbonate resin for which used are 9,9-bis(4-hydroxy-3-methylphenyl)fluorene as the dihydroxy compound (A) and spiroglycol represented by the formula (6) as the other dihydroxy compound. More preferred is one containing a structural unit derived from a 9,9-bis(4-hydroxy-3-methylphenyl)fluorene structure in an amount of from 20 mol % to 40 mol % in the structural units derived from all dihydroxy compounds, and even more preferably, in an amount of from 25 mol % to 35 mol %. When the content of the structural unit derived from 9,9-bis(4-hydroxy-3-methylphenyl)fluorene is too small, then the resin could not be given desired optical properties; but when too large, then the glass transition temperature of the resin may be too high and melt film formation and stretching would become difficult. The glass transition temperature of the polycarbonate resin having that structure is preferably from 120° C. to 150° C., even more preferably from 130° C. to 145° C., still more preferably from 135° C. to 140° C.

In case where 9,9-bis(4-hydroxy-3-methylphenyl)fluorene is used as the dihydroxy compound (A), the compound may be combined with any other dihydroxy compound differing from spiroglycol to thereby control the glass transition temperature and the optical properties of the resin and to improve the film workability. However, when the content of the structural unit derived from the other dihydroxy compound that differs from spiroglycol is too large, then there would be a probability that the resin may lose the heat resistance and the optical properties intrinsic thereto. Accordingly, in case where any other dihydroxy compound than spiroglycol is additionally used as the starting material, it is desirable that the proportion of the structural unit derived from the other dihydroxy compound is 30 mol % or less in the structural units derived from all dihydroxy compounds, more preferably 20 mol % or less, even more preferably 10 mol % or less.

As another preferred example of the polycarbonate resin, there is mentioned a polycarbonate resin for which 9,9-bis(4-(2-hydroxyethoxy)phenyl)fluorene is used as the dihydroxy compound (A) and combined with the other dihydroxy compound.

In case where 9,9-bis(4-(2-hydroxyethoxy)phenyl)fluorene is used as the dihydroxy compound (A), the other dihydroxy compound to be favorably combined with the compound is isosorbide. In this case, more preferably, the content of the structural unit derived from 9,9-bis(4-(2-hydroxyethoxy)phenyl)fluorene is from 20 mol % to 50 mol % in the structural units derived from all dihydroxy compounds, even more preferably from 30 mol % to 48 mol %. When the content of the structural unit derived from 9,9-bis(4-(2-hydroxyethoxy)phenyl)fluorene is too small, then there would be a possibility that the resin could not be given desired optical properties; but when too large, the glass transition temperature of the resin may increase too high, melt film formation and stretching would be difficult and the formed film would lose the desired optical properties. Above all, preferred is one having a glass transition temperature of from 110° C. to 160° C., more preferably from 120° C. to 150° C., even more preferably from 125° C. to 145° C. When the glass transition temperature is too high, then melt film formation and stretching would be difficult; but when too low, the heat resistance of the resin may worsen.

The polycarbonate resin containing an isosorbide-derived structural unit has a low photoelastic coefficient and can readily express retardation and has heat resistance. In addition, isosorbide is a carbon-neutral dihydroxy compound made from plants, and is useful as the other dihydroxy compound in the present invention. Further, it is more desirable to additionally use any other dihydroxy compound than isosorbide to thereby control the glass transition temperature and the optical properties of the resin and to improve the film workability.

The content of the structural unit derived from the other dihydroxy compound than isosorbide may be suitably determined in accordance with the required performance. In this case, when the content of the structural unit derived from the other dihydroxy compound than isosorbide is too large, then the resin may lose the heat resistance and the optical properties intrinsic thereto. Accordingly, in case where one having a molecular weight of 200 or less is used as the other dihydroxy compound than isosorbide, the content of the structural unit derived from the other dihydroxy compound is preferably 30 mol % or less in the structural units derived from all dihydroxy compounds, more preferably 20 mol % or less. In case where one having a molecular weight of more than 200 is used as the other dihydroxy compound than isosorbide, the content of the structural unit derived from the other dihydroxy compound is preferably 10 mol % or less in the structural units derived from all dihydroxy compounds, more preferably 5 mol % or less. Above all, in case where polyethylene glycol having a number-average molecular weight of 800 or more is used, the content of the structural unit derived from polyethylene glycol is preferably 5 mol % or less in the structural units derived from all dihydroxy compounds, more preferably 3 mol % or less, even more preferably 2 mol % or less.

The other dihydroxy compound than isosorbide may be suitably selected from the other dihydroxy compounds mentioned above. In particular, from the viewpoint of the balance of heat resistance and workability, preferred are 1,4-cyclohexanedimethanol, spiroglycol, and bisphenol A; and from the viewpoint of film formation workability and stretching workability, preferred are the dihydroxy compounds (B). More preferred are 1,6-hexanediol, diethylene glycol, triethylene glycol and polyethylene glycol; and even more preferred is polyethylene glycol. As polyethylene glycol, preferred is one having a number-average molecular weight of from 150 to 4000, and even more preferred is one having a number-average molecular weight of from 400 to 2000.

In case where 9,9-bis(4-(2-hydroxyethoxy)phenyl)fluorene is used as the dihydroxy compound (A), the other hydroxy compound preferably used along with the compound is spiroglycol. In this case, more preferably, the content of the structural unit derived from 9,9-bis(4-(2-hydroxyethoxy)phenyl)fluorene is from 30 mol % to 60 mol % in the structural units derived from all dihydroxy compounds, even more preferably from 40 mol % to 50 mol %, still more preferably from 43 mol % to 48 mol %. When the content of the structural unit derived from 9,9-bis(4-(2-hydroxyethoxy)phenyl)fluorene is too small, then the resin could not give desired optical properties; but when too large, the glass transition temperature of the resin may increase and melt film formation and stretching would become difficult, and the formed film may lose the desired optical properties. Above all, preferred is one having a glass transition temperature of from 120° C. to 150° C., more preferably from 120° C. to 135° C. When the glass transition temperature is too high, then melt film formation and stretching would become difficult; but when too low, then the heat resistance of the resin may worsen.

The polycarbonate resin containing a spiroglycol-derived structural unit has a low photoelastic coefficient, can readily exhibit retardation and can be given heat resistance, and is therefore useful here. Combined with any other dihydroxy compound than spiroglycol, the resin of the type may be further improved in that the glass transition temperature thereof can be controlled, the optical properties thereof can be controlled and the film workability thereof can be improved.

The content of the structural unit derived from the other dihydroxy compound than spiroglycol may be suitably determined in accordance with the desired performance, but when too large, the resin may lose the heat resistance and the optical properties intrinsic thereto. Accordingly, in case where one having a molecular weight of 200 or less is used as the other dihydroxy compound than spiroglycol, the content of the structural unit derived from the other dihydroxy compound is preferably 30 mol % or less in the structural units derived from all dihydroxy compounds, more preferably 20 mol % or less. In case where one having a molecular weight of more than 200 is used as the other dihydroxy compound than spiroglycol, the content of the structural unit derived from the other dihydroxy compound is preferably 10 mol % or less in the structural units derived from all dihydroxy compounds, more preferably 5 mol % or less. Above all, in case where polyethylene glycol having a number-average molecular weight of 800 or less is additionally used, the content of the structural unit derived from polyethylene glycol is preferably 5 mol % or less in the structural units derived from all dihydroxy compounds, more preferably 3 mol % or less, even more preferably 2 mol % or less.

The other dihydroxy compound than spiroglycol may be suitably selected from the other dihydroxy compounds mentioned above. In particular, from the viewpoint of the balance of heat resistance and workability, preferred are 1,4-cyclohexanedimethanol, isosorbide, and bisphenol A; and from the viewpoint of film formation workability and stretching workability, preferred are the dihydroxy compounds (B). Above all, more preferred are 1,6-hexanediol, diethylene glycol, triethylene glycol and polyethylene glycol; and even more preferred is polyethylene glycol. As polyethylene glycol, preferred is one having a number-average molecular weight of from 150 to 4000, and even more preferred is one having a number-average molecular weight of from 400 to 2000.

In case where 9,9-bis(4-(2-hydroxyethoxy)phenyl)fluorene is used as the dihydroxy compound (A), the other dihydroxy compound that is to be preferably used along with the compound is 2,2-bis(4-hydroxyphenyl)propane (=bisphenol A). In this case, more preferably, the content of the structural unit derived from 9,9-bis(4-(2-hydroxyethoxy)phenyl)fluorene is from 60 mol % to 90 mol % relative to the structural units derived from all dihydroxy compounds, even more preferably from 70 mol % to 85 mol %, still more preferably from 74 mol % to 80 mol %. When the content of the structural unit derived from 9,9-bis(4-(2-hydroxyethoxy)phenyl)fluorene is too small or too large, there is a probability that the resin could not be given the desired optical properties. In addition, when the content of the structural unit derived from 9,9-bis(4-(2-hydroxyethoxy)phenyl)fluorene is too small, then the content of the structural unit derived from bisphenol A increases relatively with the result that the photoelastic coefficient of the resin increases and the optical properties of the film may change owing to external stress given thereto. Above all, preferred is one having a glass transition temperature of from 120° C. to 160° C., more preferably from 130° C. to 155° C., even more preferably from 145° C. to 150° C. When the glass transition temperature is too high, then melt film formation would be difficult; but when too low, then the heat resistance of the film may worsen.

Bisphenol A is inexpensive and is easy to handle, and can impart heat resistance to the resin. Therefore, the compound is useful as the other dihydroxy compound in the present invention. Further combined with any other dihydroxy compound than bisphenol A, the compound is effective for controlling the glass transition temperature and the optical properties of the resin and for improving the film workability.

The content of the structural unit derived from the other dihydroxy compound than bisphenol A may be suitably determined depending on the necessary performance. When the content is too large, there is a probability that the resin may lose the heat resistance and the optical properties intrinsic thereto. Accordingly, in case where one having a molecular weight of 200 or less is used as the other dihydroxy compound than bisphenol A, the content of the structural unit derived from the other dihydroxy compound is preferably 30 mol % or less relative to the structural units derived from all dihydroxy compounds, more preferably 20 mol % or less. In case where one having a molecular weight of more than 200 is used as the other dihydroxy compound than bisphenol A, the content of the structural unit derived from the other dihydroxy compound is preferably 10 mol % or less relative to the structural units derived from all dihydroxy compounds, more preferably 5 mol % or less. Above all, in case where polyethylene glycol having a number-average molecular weight of 800 or more is additionally used, the content of the structural unit derived from polyethylene glycol is preferably 5 mol % or less in all dihydroxy compounds, more preferably 3 mol % or less, even more preferably 2 mol % or less.

The other dihydroxy compound than bisphenol A may be suitably selected from the other dihydroxy compounds mentioned above. In particular, from the viewpoint of the balance of heat resistance and workability, preferred are 1,4-cyclohexanedimethanol, isosorbide, and spiroglycol; and from the viewpoint of film formation workability and stretching workability, preferred are the dihydroxy compounds (B). Above all, more preferred are 1,6-hexanediol, diethylene glycol, triethylene glycol and polyethylene glycol; and even more preferred is polyethylene glycol. As polyethylene glycol, preferred is one having a number-average molecular weight of from 150 to 4000, and even more preferred is one having a number-average molecular weight of from 400 to 2000.

As preferred examples of the polyester carbonate resin, there are mentioned polyester carbonate resins in which 9,9-bis(4-(2-hydroxyethoxy)phenyl)fluorene is used as the dihydroxy compound (A) and terephthalic acid or isophthalic acid, more preferably terephthalic acid is used as the dicarboxylic acid compound. The terephthalic acid or isophthalic acid component can be the dicarboxylic acid itself that serves as the starting material of the polymer. However, in case where the polymer is produced according to an interesterification method to be mentioned below, preferred is used of a diester form such as dimethyl terephthalate, dimethyl isophthalate or the like from the viewpoint of easiness in the reaction. Especially preferably, the content of the structural unit derived from 9,9-bis(4-(2-hydroxyethoxy)phenyl)fluorene is from 60 mol % to 90 mol % relative to the total, 100 mol %, of the structural units derived from all dihydroxy compounds and all dicarboxylic acid structures, more preferably from 65 mol % to 80 mol %, even more preferably from 68 mol % to 77 mol %. When the content of the structural unit derived from 9,9-bis(4-(2-hydroxyethoxy)phenyl)fluorene is too small or too large, then the resin could not be give the desired optical properties. The glass transition temperature of the polyester polycarbonate resin having that structure is preferably from 120° C. to 170° C., more preferably from 130° C. to 160° C., even more preferably from 145° C. to 154° C.

Further combined with any other dihydroxy compound than 9,9-bis(4-(2-hydroxyethoxy)phenyl)fluorene, the polyester carbonate resin can be more improved in that the glass transition temperature and the optical properties thereof can be controlled and the film workability thereof can be improved. However, when the content of the other dihydroxy compound is too large, then the resin may lose the heat resistance and the optical properties intrinsic thereto. Accordingly, in case where the other dihydroxy compound is additionally used, then the content thereof is preferably 20 mol % or less relative to the structural units derived from all dihydroxy compounds, more preferably 10 mol % or less, even more preferably 5 mol % or less.

Combined with any other dicarboxylic acid than an aromatic dicarboxylic acid, the polyester carbonate resin can also be improved in that the glass transition temperature and the optical properties thereof can be controlled and the film workability thereof can be improved. However, when the content of the other dicarboxylic acid than an aromatic dicarboxylic acid is too large, then the resin may lose the heat resistance and the optical properties intrinsic thereto. Accordingly, in case where the other dicarboxylic acid than an aromatic dicarboxylic acid is additionally used, then the content thereof is preferably 20 mol % or less relative to all dicarboxylic acid structures, more preferably 10 mol % or less, even more preferably 5 mol % or less.

<Production Method for Polycarbonate Resin, Polyester Carbonate Resin>

The polycarbonate resin can be produced according to a polymerization method generally employed in the art. The polymerization method may be any of an interfacial polymerization method using phosgene or the like, or a melt polymerization method of reacting a dihydroxy compound and a carbonic diester through interesterification. Of those, the interfacial polymerization method must use a chlorine-containing solvent such as phosgene that is highly toxic or methylene chloride, chlorobenzene or the like that may cause environmental disruption, and in addition, when such a chlorine-containing solvent remains even only slightly in polycarbonate, then the chlorine component that may evaporate away during film formation of stretching operation may corrode or damage the film formation apparatus or the stretching apparatus, and after the formed film is incorporated in a retardation plate, the evaporating component may have some negative influence on the other members. Consequently, preferred is the melt polymerization method of reacting a dihydroxy compound and a carbonic diester in the presence of a polymerization catalyst without using a solvent.

The polyester carbonate resin may also be produced according to a polymerization method generally employed in the art. For example, employable here is any of a method of reacting a dihydroxy compound and a dicarboxylic acid or a dicarboxylic acid halide and phosgene in the presence of a solvent, or a melt polymerization method of reacting a dihydroxy compound and a dicarboxylic acid or a dicarboxylic ester and a carbonic diester through interesterification without using a solvent. For the same reason as above, preferred is the melt polymerization method of reacting a dihydroxy compound and a carbonic diester in the presence of a polymerization catalyst.

The carbonic diester to be used in the melt polymerization method is generally one represented by the following general formula (8):

[Chem. 17]

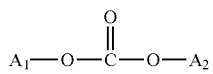

(8)

(in the general formula (8), $A_1$ and $A_2$ each independently represent a substituted or unsubstituted aliphatic group having from 1 to 18 carbon atoms, or a substituted or unsubstituted aromatic group having from 6 to 18 carbon atoms).

As the carbonic diester represented by the above-mentioned general formula (8), for example, there are exemplified substituted diphenyl carbonates such as typically diphenyl carbonate, ditolyl carbonate, as well as dimethyl carbonate, diethyl carbonate, di-t-butyl carbonate, etc. Especially preferred are diphenyl carbonate and substituted diphenyl carbonates. One or more of these carbonic diesters may be used here either singly or as combined.

In case where a polycarbonate resin is produced, the carbonic diester is used preferably in a molar ratio of from 0.90 to 1.10 relative to all dihydroxy compounds to be used in the reaction, more preferably in a molar ratio of from 0.96 to 1.05, even more preferably from 0.98 to 1.03. On the other hand, in case where a polyester carbonate resin is produced, the carbonic diester is used preferably in a molar ratio of from 0.90 to 1.20 relative to the molar number of the dihydroxy compounds calculated by subtracting the molar number of all dicarboxylic acids from the molar number of all dihydroxy compounds used, more preferably in a molar ratio of from 0.96 to 1.15, even more preferably from 0.98 to 1.10. When the molar ratio is too small, then the terminal hydroxy groups in the produced polycarbonate resin may increase and therefore the heat stability of the polymer may worsen and a desired polymer could not be obtained. On the other hand, when the molar ratio is too large, then the interesterification rate under the same condition may lower and it would be difficult to produce a polycarbonate resin having a desired molecular weight, and moreover, the remaining carbonic diester amount in the produced polycarbonate resin may increase and the remaining carbonic diester would evaporate away during film formation or stretching, therefore often causing film defects.

As the polymerization catalyst in melt polymerization (that is, the interesterification catalyst), usable are an alkali metal compound and/or an alkaline earth metal compound. Along with an alkaline earth compound and/or an alkaline earth metal compound, secondarily usable is a basic compound such as a basic boron compound, a basic phosphorus compound, a basic ammonium compound, an amine compound or the like, but more preferably, only an alkali metal compound and/or an alkaline earth metal compound are used here.

As the alkali metal compound to be used here as the polymerization catalyst, for example, there are mentioned sodium hydroxide, potassium hydroxide, lithium hydroxide, cesium hydroxide, sodium hydrogencarbonate, potassium hydrogencarbonate, lithium hydrogencarbonate, cesium hydrogencarbonate, sodium carbonate, potassium carbonate, lithium carbonate, cesium carbonate, sodium acetate potassium acetate, lithium acetate, cesium acetate, sodium stearate, potassium stearate, lithium stearate, cesium stearate, sodium borohydride, potassium borohydride, lithium borohydride, cesium borohydride, sodium borophenylate, potassium borophenylate, lithium borophenylate, cesium borophenylate, sodium benzoate, potassium benzoate, lithium benzoate, cesium benzoate, disodium hydrogenphosphate, dipotassium hydrogenphosphate, dilithium hydrogenphosphate, dicesium hydrogenphosphate, disodium phenylphosphate, dipotassium phenylphosphate, dilithium phenylphosphate, dicesium phenylphosphate, sodium, potassium lithium and cesium alcoholates and phenolates, as well as disodium salts, dipotassium salts, dilithium salts and dicesium salts of bisphenol A, etc.

As the alkaline earth metal compound, for example, there are mentioned calcium hydroxide, barium hydroxide, magnesium hydroxide, strontium hydroxide, calcium hydrogencarbonate, barium hydrogencarbonate, magnesium hydrogencarbonate, strontium hydrogencarbonate, calcium carbonate, barium carbonate, magnesium carbonate, strontium carbonate, calcium acetate, barium acetate, magnesium acetate, strontium acetate, calcium stearate, barium stearate, magnesium stearate, strontium stearate, etc. Above all, from the viewpoint of polymerization activity, preferred are magnesium compounds and calcium compounds. In this description, the terms "alkali metal" and "alkaline earth metal" are used as the same meanings as those of "Group 1 element" and "Group 2 element" in the Long-Periodic Table (Nomenclature of Inorganic Chemistry IUPAC Recommendations 2005).

One alone or two or more such alkali metal compounds and/or alkaline earth metal compounds may be used here either singly or as combined.

Specific examples of the basic boron compound that may be used along with the alkali metal compound and/or the alkaline earth metal compound include sodium salts, potassium salts, lithium salts, calcium salts, barium salts, magnesium salts or strontium salts of tetramethylboron, tetraethylboron, tetrapropylboron, tetrabutylboron, trimethylethylboron, trimethylbenzylboron, trimethylphenylboron, triethylmethylboron, triethylbenzylboron, triethylphenylboron, tributylbenzylboron, tributylphenylboron, tetraphenylboron, benzyltriphenylboron, methyltriphenylboron, butyltriphenylboron, etc.

The basic phosphorus compound includes, for example, triethyl phosphine, tri-n-propyl phosphine, triisopropyl phosphine, tri-n-butyl phosphine, triphenyl phosphine, tributyl phosphine, quaternary phosphonium salts, etc.

The basic ammonium compound includes, for example, tetramethylammonium hydroxide, tetraethylammonium hydroxide, tetrapropylammonium hydroxide, tetrabutylammonium hydroxide, trimethylethylammonium hydroxide, trimethylbenzylammonium hydroxide, trimethylphenylammonium hydroxide, triethylmethylammonium hydroxide, triethylbenzylammonium hydroxide, triethylphenylammonium hydroxide, tributylbenzylammonium hydroxide, tributylphenylammonium hydroxide, tetraphenylammonium hydroxide, benzyltriphenylammonium hydroxide, methyltriphenylammonium hydroxide, butyltriphenylammonium hydroxide, etc.

The amine compound includes, for example, 4-aminopyridine, 2-aminopyridine, N,N-dimethyl-4-aminopyridine, 4-diethylaminopyridine, 2-hydroxypyridine, 2-methoxypyridine, 4-methoxypyridine, 2-dimethylaminoimidazole, 2-methoxyimidazole, imidazole, 2-mercaptoimidazole, 2-methylimidazole, aminoquinoline, etc.

One alone or two or more different types of these basic compounds may be used here either singly or as combined.

The amount of the polymerization catalyst to be used is generally within a range of from 0.1 µmol to 100 µmol, in terms of the metal amount therein, relative to one mole of all dihydroxy compounds used for the reaction, preferably within a range of from 0.5 µmol to 50 µmol, more preferably within a range of from 1 µmol to 25 µmol.

When the amount of the polymerization catalyst used is too small, then the polymerization activity necessary for producing the polycarbonate resin having a desired molecular weight could not be secured; but on the other hand, when the amount of the polymerization catalyst used is too large, then the obtained polycarbonate resin would discolor, and side products may be produced and therefore the flowability of the product may lower or gels may form and, as a result, it would be difficult to produce a polycarbonate resin having a targeted quality.

In case where a polyester carbonate resin is produced, an interesterification catalyst such as a titanium compound, a tin compound, a germanium compound, an antimony compound, a zirconium compound, a lead compound, an osmium compound or the like can be used together with or not together with the above-mentioned basic compound. The amount of the interesterification catalyst to be used is generally within a range of from 10 µmol to 1 mmol, in terms of the metal amount therein, relative to one mol of all dihydroxy compounds used for the reaction, preferably within a range of from 20 µmol to 800 µmol, more preferably within a range of from 50 µmol to 500 µmol.

In producing the polycarbonate resin or the polyester carbonate resin mentioned above, the dihydroxy compound to be the starting material may be supplied as a solid or may be supplied as a molten state by heating. In case where the melting point of the dihydroxy compound is higher than 150° C., there is a probability that the compound may color when melted alone, and therefore, it is desirable that the compound of the type is applied after dissolved in a carbonic diester or in a dihydroxy compound having a low melting point.

According to the method for producing the polycarbonate resin or the polyester carbonate resin through melt polymerization, a dihydroxy compound, a carbonic diester and an optional dicarboxylic acid compound are reacted in the presence of a polymerization catalyst. In general, the polymerization is carried out in a multi-stage step of two or more stages, in which one polymerization reactor may be used in two or more stages under different conditions, or two or more reactors may be used in two or more stages while changing the condition in each reactor. From the viewpoint of the production efficiency, two or more, preferably three or more, more preferably from three to five, even more preferably four reactors are used to carry out the polymerization. The polymerization reaction may be in any mode of batchwise or continuous reaction, or a combination of batchwise and continuous reactions. From the viewpoint of the production efficiency and the quality stability, preferred is a continuous mode reaction.

The polymerization catalyst may be added to the starting material preparing tank or the starting material storing tank, or may be added directly to the polymerization tank. From the viewpoint of the supply stability and the polymerization control, it is desirable that a catalyst supply line is arranged during the starting material line before the material is supplied into the polymerization tank and the polymerization catalyst is supplied to the line as an aqueous solution or a phenolic solution thereof.

Regarding the temperature of the polymerization reaction, when the temperature is too low, then the productivity may lower and the thermal history to products may increase; but when too high, not only the monomer may evaporate away but also decomposition or discoloration of the polycarbonate resin or the polyester carbonate resin may be promoted.

In the melt polymerization reaction, it is important to control the balance between the temperature and the pressure in the reaction system. When any one of the temperature and the pressure is varied too rapidly, then the unreacted monomer may be distilled out of the reaction system so that the molar ratio of the dihydroxy compound and the carbonic diester may vary and therefore the desired polycarbonate resin or polyester carbonate resin could not be obtained.

Specifically, in the first-stage reaction, the maximum inner temperature of the polymerization reactor is from 130° C. to 250° C., preferably from 140° C. to 240° C., more preferably from 150° C. to 230° C., and at such an inner temperature, the reaction is carried out under a pressure of from 110 kPa to 1 kPa, preferably from 70 kPa to 3 kPa, more preferably from 30 kPa to 5 kPa (absolute pressure), for from 0.1 hours to 10 hours, preferably for from 0.5 hours to 3 hours, while the generated monohydroxy compound and water are evaporated out of the reaction system.

In and after the second stage, the pressure in the reaction system is gradually lowered from the pressure in the first stage, and subsequently while the generated monohydroxy compound and water are evaporated out of the reaction system, the polymerization is continued finally under a pressure of the reaction system (absolute pressure) of 5 kPa or less, preferably 3 kPa or less, at a maximum inner temperature of from 210° C. to 270° C., preferably from 220° C. to 250° C., and generally for from 0.1 hours to 10 hours, preferably from 0.5 hours to 6 hours, more preferably from 1 hour to 3 hours.

Especially for obtaining a polycarbonate resin or a polyester carbonate resin having good color phase and light resistance while preventing discoloration and thermal degradation, it is desirable that a horizontal reactor excellent in plug flowability and interfacial renewability is used in the final polymerization stage.

The obtained polycarbonate resin or polyester carbonate resin is, after further processed for polycondensation reaction as described above, generally cooled and solidified and then pelletized with a rotary cutter or the like.

The pelletization method is not specifically defined, but there may be mentioned a method that includes drawing a melt out of the final polymerization reactor and cooling and solidifying the resulting strands and pelletizing them; a method that includes supplying a resin melt from the final polymerization reactor to a monoaxial or biaxial extruder, melt-extruding it therethrough, and then cooling and solidifying it, followed by pelletization; or a method that includes drawing a melt out of the final polymerization reactor, once cooling and solidifying the strands and pelletizing them, and thereafter again supplying them to a monoaxial or biaxial extruder followed by melt-extruding, and then cooling and solidifying it followed by pelletization. Above all, preferred is a method that includes feeding a resin melt from the final polymerization reactor to a monoaxial or biaxial extruder having one or more vents, melt-extruding it while the low-molecular components such as the monohydroxy compound and others are removed by depressurizing the chamber through the vent, and thereafter cooling and solidifying it followed by pelletization.

The molecular weight of the polycarbonate resin or the polyester carbonate resin thus obtained through polycondensation can be expressed as a reduced viscosity thereof. When the recued viscosity of the polycarbonate resin or the polyester carbonate resin is too low, then the mechanical strength of the molded article may lower. Accordingly, the reduced viscosity thereof is preferably 0.20 dL/g or more, more preferably 0.30 dL/g or more, even more preferably 0.33 dL/g or more, most preferably 0.35 dL/g or more. On the other hand, when the reduced viscosity is too large, then the flowability in molding may lower and therefore the productivity and the moldability may tend to lower. Accordingly, the reduced viscosity is preferably 1.00 dL/g or less, more preferably 0.80 dL/g or less, even more preferably 0.70 dL/g or less. The reduced viscosity is measured as follows. Using methylene chloride as a solvent, the concentration of the polycarbonate resin or the polyester carbonate resin is accurately controlled to be 0.6 g/dL, and at a temperature of 20.0° C.±0.1° C., the viscosity of the sample is measured with an Ubbelohde viscometer.

The melt viscosity of the polycarbonate resin or the polyester carbonate resin is preferably from 1000 Pa·s to 4000 Pa·s at a temperature of 240° C. and at a shear rate of 91.2 $sec^{-1}$. More preferably, the melt viscosity is from 1200 Pa·s to 3800 Pa·s, even more preferably from 1500 Pa·s to 3500 Pa·s. In this description, the melt viscosity is measured using a capillary rheometer (by Toyo Seiki).

A heat stabilizer may be incorporated in the polycarbonate resin or the polyester carbonate resin for preventing the molecular weight of the resin from lowering and preventing the resin from discoloring during polymerization or molding.

As the heat stabilizer, there are mentioned generally-known, hindered phenol-based heat stabilizers and/or phosphorus-based heat stabilizers.

Concretely, the hindered phenol-based compounds include 2,6-di-tert-butylphenol, 2,4-di-tert-butylphenol, 2-tert-butyl-4-methoxyphenol, 2-tert-butyl-4,6-dimethylphenol, 2,6-di-tert-butyl-4-methylphenol, 2,6-di-tert-butyl-4-ethylphenol, 2,5-di-tert-butylhydroquinone, n-octadecyl 3-(3',5'-di-tert-butyl-4'-hydroxyphenyl)propionate, 2-tert-butyl-6-(3'-tert-butyl-5'-methyl-2'-hydroxybenzyl)-4-methylphenylacrylate, 2,2'-methylene-bis-(4-methyl-6-tert-butylphenol), 2,2'-methylene-bis-(6-cyclohexyl-4-methylphenol), 2,2'-ethylidene-bis-(2,4-di-tertbutylphenol), tetrakis-[methylene-3-(3',5'-di-tert-butyl-4'-hydroxyphenyl)propionate]-methane, 1,3,5-trimethyl-2,4,6-tris-(3,5-di-tert-butyl-4-hydroxybenzyl)benzene, etc. Above all, preferred are tetrakis-[methylene-3-(3',5'-di-tert-butyl-4'-hydroxyphenyl)propionate]-methane, n-octadecyl-3-(3', 5'-di-tert-butyl-4'-hydroxyphenyl)propionate, and 1,3,5-trimethyl-2,4,6-tris-(3,5-di-tert-butyl-4-hydroxybenzyl)benzene.

The phosphorus-based compounds include phosphorous acid, phosphoric acid, phosphonous acid, phosphonic acid and their esters. Concretely, there are mentioned triphenyl phosphite, tris(nonylphenyl)phosphite, tris(2,4-di-tert-butylphenyl)phosphite, tridecyl phosphite, trioctyl phosphite, trioctadecyl phosphite, didecylmonophenyl phosphite, dioctylmonophenyl phosphite, diisopropylmonophenyl phosphite, monobutyldiphenyl phosphite, monodecyldiphenyl phosphite, monooctyldiphenyl phosphite, bis(2,6-di-tert-butyl-4-methylphenyl)pentaerythritol diphosphite, 2,2-methylenebis(4,6-di-tert-butylphenyl)octyl phosphite, bis(nonylphenyl) pentaerythritol diphosphite, bis(2,4-di-tert-butylphenyl) pentaerythritol diphosphite, distearylpentaerythritol diphosphite, tributyl phosphate, triethyl phosphate, trimethyl phosphate, triphenyl phosphate, diphenyl-monoorthoxenyl phosphate, dibutyl phosphate, dioctyl phosphate, diisopropyl phosphate, tetrakis(2,4-di-tert-butylphenyl) 4,4'-biphenylenediphosphinate, dimethyl benzenephosphonate, diethyl benzenephosphonate, dipropyl benzenephosphonate, etc.

One alone or two or more of these heat stabilizers may be used here either singly or as combined. The heat stabilizer may be further incorporated in the resin in addition to the amount thereof added during melt polymerization. Specifically, when a suitable amount of a heat stabilizer is incorporated to give a polycarbonate resin or a polyester carbonate resin, and then the heat stabilizer is further incorporated in the resin according to the incorporation method to be mentioned below, then it is possible to incorporate a more amount of the heat stabilizer to prevent discoloration of the resin while evading various troubles of haze increase, discoloration and heat resistance degradation during polymerization.

The amount of the heat stabilizer to be added is preferably from 0.0001 parts by mass to 1 part by mass, relative to 100 parts by mass of the polycarbonate resin or the polyester carbonate resin, more preferably from 0.0005 parts by mass to 0.5 parts by mass, even more preferably from 0.001 parts by mass to 0.2 parts by mass.

A generally-known antioxidant may be incorporated in the polycarbonate resin or the polyester carbonate resin for preventing oxidation of the resin.

As the antioxidant, for example, there are mentioned one or more of pentaerythritol tetrakis(3-mercaptopropionate), pentaerythritol tetrakis(3-laurylthiopropionate, glycerol 3-stearylthiopropionate, triethylene glycol-bis[3-(3-tert-butyl-5-methyl-4-hydroxyphenyl)propionate], 1,6-hexanediol-bis[3-(3,5-di-tert-butyl-4-hydroxyphenyl)propionate], pentaerythritol tetrakis[3-(3,5-di-tert-butyl-4-hydroxyphenyl)propionate], octadecyl-3-(3,5-di-tert-butyl-4-hydroxyphenyl)propionate, 1,3,5-trimethyl-2,4,6-tris(3,5-di-tert-butyl-4-hydroxybenzyl)benzene, N,N-hexamethylenebis(3,5-di-tert-butyl-4-hydroxyhydrocinnamide), 3,5-di-tert-butyl-4-hydroxybenzylphosphonate diethyl ester, tris(3,5-di-tert-butyl-4-hydroxybenzyl) isocyanurate, tetrakis(2,4-di-tert-butylphenyl) 4,4'-biphenylenediphosphinate, 3,9-bis {1,1-dimethyl-2-[β-(3-tert-butyl-4-hydroxy-5-methylphenyl)propionyloxy]ethyl}-2,4,8,10-tetroxaspiro(5,5)undecane, etc.

The amount of the antioxidant to be added is preferably from 0.0001 parts by mass to 0.5 parts by mass relative to 100 parts by mass of the polycarbonate resin or the polyester carbonate resin.

The polycarbonate resin or the polyester carbonate resin may be kneaded with one or more thermoplastic resins, such as aromatic polycarbonates, aromatic polyesters, aliphatic polyesters, polyamides, polystyrene, styrene/methacrylate copolymers, styrene/methacrylic acid copolymers, styrene/N-phenylmaleimide copolymers, ABS, AS, PMMA, polyolefins, amorphous polyolefins, polylactic acid, polybutylene succinate, rubber, elastomers and the like, thereby giving a polymer alloy for use herein.

Using a suitable amount of the above-mentioned thermoplastic resin excellent in mechanical properties and melt workability, as a modifying agent, the mechanical properties and the melt workability of the resin can be improved while the necessary optical properties and heat resistance thereof can be secured as such.

Of the above-mentioned thermoplastic resins, especially preferred are polystyrene, styrene copolymers such as styrene/methacrylic acid copolymers, and aromatic polycarbonates, as having good miscibility with the polycarbonate resin or the polyester carbonate resin and capable of having good transparency since the refractive index thereof is close to that of the polycarbonate resin or the polyester carbonate resin.

For imparting flexibility and melt workability to the polycarbonate resin or the polyester carbonate resin, a plasticizer or the like may be added thereto to suitably lower the glass transition temperature of the resin. The plasticizer may be any one capable of lowering the glass transition temperature of the polycarbonate resin or the polyester carbonate resin, for which usable here is a generally-known compound having a long-chain alkyl group or an aryl group. Concretely, there are mentioned phthalate esters such as bis(2-ethylhexyl) phthalate, adipate esters such as bis(2-ethylhexyl) adipate; fatty acids such as stearic acid, calcium stearate, etc.; fatty acid esters such as ethylene glycol distearate, etc.; phosphate ester such as tricresyl phosphate, tris(2-ethylhexyl)phosphate, etc.; fatty acid amides; higher alcohols such as stearyl alcohol, etc.; liquid paraffin, etc.

A low-molecular-weight polymer may also be used as a modifying agent. Concretely, there are mentioned styrene oligomer, polyhydroxypolyolefin oligomer (Polytail™), terpenephenol resin, etc.

When an excessive amount of the above-mentioned modifying agent is used, then the transparency of the resin may lower, or the amount of the volatile component to form during melt processing may increase therefore causing increase in impurities. On the other hand, when the amount is too small, a sufficient modifying effect could not be obtained. Accordingly, the amount of the modifying agent to be added is preferably from 0.1 wt % to 10 wt % relative to the polycarbonate resin or the polyester carbonate resin, more preferably from 0.2 wt % to 5 wt %, even more preferably from 0.3 wt % to 3 wt %.

Before conducting the various moldings, the modifying agent may be mixed in the resin, using a tumbler, a super mixer, a floater, a V-type blender, a Nature mixer, a Banbury mixer, an extruder or the like.

<Production Method for Retardation Film Web>

The polycarbonate resin or the polyester carbonate resin may be formed into a long film according to a film formation method such as a melt extrusion method (for example, T-die molding method), a cast coating method (for example, casting method), a calender molding method, a hot pressing method, a coextrusion method, a co-melting method, a multilayer extrusion method, an inflation molding method, etc. Hereinafter the film is, when appropriate, referred to as "unstretched film webunstretched film web".

Next, while kept feeding in the longitudinal direction, the unstretched film webunstretched film web is stretched in the direction at an angle falling within the above-mentioned specific range relative to the width direction for continuous oblique stretching. Accordingly, there can be obtained a retardation film web in which the angle between the width direction and the slow axis (orientation angle θ) falls within the above-mentioned specific range.

The oblique stretching method is not specifically defined, so long as the unstretched film webunstretched film web is continuously stretched in the direction at an angle falling with the above-mentioned specific angle relative to the width direction thereof so that the slow axis of the film can be formed in the direction at the angle falling within the specific angle relative to the width direction of the film. Examples of the oblique stretching method include a method of stretching the film while marginal portions of both sides of the film are kept held and while the film is held with clips running on a rail bent at least once or more or indefinite times in one direction, as described in JP-A-2005-319660; and a method of stretching the film by driving a pair of clips oppositely arranged in the direction oblique to the film feeding direction, in that oblique direction, as described in JP-A-2007-30466. A suitable method may be selected from such known stretching methods, and may be employed here.

A known stretcher may be used as the stretching machine for the oblique stretching. For example, employable here is a tenter-type stretcher capable of applying a feeding force or a tensile force or a drawing force at a different speed on the right and left sides, in at least one direction of the width direction and the longitudinal direction. The tenter-type stretcher includes a horizontal monoaxial stretcher, and a simultaneous biaxial stretcher. Any suitable stretcher can be used here, so long as a long film can be stretched obliquely in a continuous stretching mode. Above all, preferred is use of a simultaneous biaxial stretcher which includes multiple clips for holding marginal portions of both sides of a film and in which the clip to hold one side and the clip to hold the other side can be driven at a different driving speed. In this case, when a film is stretched in the two directions of the longitudinal direction and the width direction thereof, the clip on the marginal portion of one side of the film and the clip on the marginal portion of the other side thereof can be driven in the longitudinal direction of the film at a different speed. As a result, oblique stretching of the unstretched film webunstretched film web can be attained more efficiently, and in addition, the retardation film web to be obtained is hardly wrinkled in the oblique direction.

As the stretcher for oblique stretching, more preferred is a simultaneous biaxial stretcher where the driving speed of the individual clips can be controlled. Using the simultaneous biaxial stretcher of the type, the clips on marginal portions of both sides of the film can be driven at a constant speed during feeding the film, and for stretching the film, the clip on one side and the clip on the other side are driven at a different speed as mentioned above. Accordingly, the force to be given to the film can be suitably controlled, and the retardation film web to be obtained is more hardly wrinkled in the oblique direction.

The oblique stretching temperature is preferably from Tg−30° C. to Tg+60° C., in which Tg indicates the glass transition temperature of the polycarbonate resin or the polyester carbonate resin to form the unstretched film webunstretched film web, more preferably from Tg−10° C. to Tg+50° C., even more preferably from Tg−5° C. to Tg+30° C., still more preferably from Tg−3° C. to Tg+20° C. The draw ratio is typically from 1.01 to 10 times, preferably from 1.1 to 5 times, more preferably from 1.2 to 3 times, even more preferably from 1.3 to 2.5 times. When the draw ratio is too low, then it would be difficult to express the desired retardation; but when too high, it would be difficult to accurately control the retardation and the film may be broken.

As the other oblique stretching methods, for example, there are mentioned the methods described in JP-A-50-83482, JP-A-2-113920, JP-A-3-182701, JP-A-2000-9912, JP-A-2002-86554 and JP-A-2002-22944, which are incorporated herein by reference. After the oblique stretching as above, the obtained retardation film web may be heat-treated at 80 to 165° C., preferably at 100 to 150° C. The heat treatment may relax the stress in the obliquely-stretched, retardation film web. As a result, the obtained retardation film web can be protected from retardation change when exposed to heat.

<Long Polarizing Film>

As the long polarizing film, employable here is a polarizing film having an absorption axis in any of the width direction and the longitudinal direction thereof. Concretely, there are mentioned those produced by adsorbing a dichroic substance such as iodine, a dichroic dye or the like to a hydrophilic polymer film such as a polyvinyl alcohol film, a partially-formalized polyvinyl alcohol film, a partially-saponified ethylene/vinyl acetate copolymer film or the like followed by monoaxially stretching it; polyene oriented films of dehydrated products of polyvinyl alcohol or dehydrochlorinated products of polyvinyl chloride, etc. Of those, especially preferred are long polarizing films produced by adsorbing a dichroic substance such as iodine or the like to a polyvinyl alcohol film followed by monoaxially stretching it, since they have high polarization dichroic ratio. Not specifically defined, the thickness of the long polarizing film is generally from 1 to 80 μm or so.

The long polarizing film that is produced by adsorbing iodine to a polyvinyl alcohol film followed by monoaxially stretching it can be produced, for example, by dipping polyvinyl alcohol in an aqueous solution of iodide to be dyed, and then stretching it by from 3 to 7 times the original length thereof. If desired, the dipping bath may contain boric acid, zinc sulfate, zinc chloride or the like, and the film may be dipped in an aqueous solution of potassium iodide or the like. Further if desired, the polyvinyl alcohol film before dyed may be dipped in water for washing it.

Washing the polyvinyl alcohol film with water is effective not only for removing the contaminants and the blocking inhibitor from the surface of the polyvinyl alcohol film but also for swelling the polyvinyl alcohol film to prevent any uneven dyeing. The film may be stretched after dyed with iodine or may be stretched during dyeing therewith, or after stretched, the film may be dyed with iodine. The film may be stretched in an aqueous solution of boric acid, potassium iodide or the like or in a water bath.

<Production of Laminate Film Web and Circularly Polarizing Plate>

The retardation film web and the long polarizing film produced in the manner as above are continuously fed in the longitudinal direction each in the retardation film feeding step and in the polarizing film feeding step. Next, in the lamination step, the thus-fed retardation film web and long polarizing film are laminated so that their longitudinal directions are aligned with each other, therefore continuously producing a laminate film web using a roller or the like. The retardation film web and the long polarizing film may be laminated via an adhesive. The adhesive may be any known adhesive so long as it does not impair the optical properties of the long lamination film. Subsequently, the laminate film web is cut into a desired size to give a circularly polarizing plate.

EXAMPLES

The present invention is described in more detail with reference to the following Examples; however, not overstepping the gist thereof, the present invention is not limited by the following Examples. The abbreviations of the compounds used in the description of those Examples are as follows.

BHEPF: 9,9-bis[4-(2-hydroxyethoxy)phenyl]fluorene [manufactured by Osaka Gas Chemicals]

BCF: 9,9-bis(4-hydroxy-3-methylphenyl)fluorene [manufactured by Osaka Gas Chemicals]

ISB: isosorbide [manufactured by Roquette Freres; trade name: POLYSORB]

SPG: spiroglycol [manufactured by Mitsubishi Gas Chemical]

DEG: diethylene glycol [manufactured by Mitsubishi Chemical]

PEG#1000: polyethylene glycol, number-average molecular weight 1000 [manufactured by Sanyo Chemical Industries]

DMT: dimethyl terephthalate [manufactured by Tokyo Chemical Industry]

DPC: diphenyl carbonate [manufactured by Mitsubishi Chemical]

Example 1

Production of Retardation Film Web

A batch polymerization apparatus including two vertical reactors each equipped with a stirrer and a reflux condenser controlled at 100° C. was used for polymerization. BHEPF, ISB, DEG, DPC and magnesium acetate 4-hydrate were fed into the reactor in a ratio by mol of BHEPF/ISB/DEG/DPC/magnesium acetate=0.348/0.490/0.162/1.005/1.00×10$^{-5}$. The reactor was fully purged with nitrogen (oxygen concentration, 0.0005 to 0.001 vol %), then heated with a heating medium, and when the internal temperature reached 100° C., stirring the contents was started. In 40 minutes after the start of heating, the internal temperature was made to reach 220° C., and while controlling to keep this temperature, depressurization was started at the same time. In 90 minutes after the temperature reached 220° C., the pressure was made to be 13.3 kPa. The phenol vapor produced as a side product along with polymerization was introduced into the reflux condenser at 100° C., and the monomer component contained slightly in the phenol vapor was returned back to the reactor. The phenol vapor not condensed was introduced into a condenser at 45° C. and collected.

Nitrogen was introduced into the first reactor and the pressure therein was once restored to atmospheric pressure, and then the oligomerized reaction liquid in the first reactor was transferred into the second reactor. Next, the second reactor was heated and depressurized, and in 50 minutes, the internal temperature reached 240° C. and the pressure reached 0.2 kPa. Subsequently, the polymerization was continued until arrival to the predetermined stirring force. On arrival at the predetermined force, nitrogen was introduced into the reactor for pressure restoration, and the reaction liquid was drawn away as strands, and pelletized with a rotary cutter to give a polycarbonate resin A having a copolymerization composition of BHEPF/ISB/DEG=34.8/49.0/16.2 [mol %]. The reduced viscosity of the polycarbonate resin was 0.430 dL/g, and the glass transition temperature thereof was 128° C.

The obtained polycarbonate resin A was dried in vacuum at 80° C. for 5 hours, and then using a film formation apparatus equipped with a single-screw extruder (manufactured by Isuzu Machinery, screw diameter 25 mm, cylinder preset temperature: 220° C.), a T-die (width 200 mm, preset temperature: 220° C.), a chill roll (preset temperature: 120 to 130° C.) and a winder, this was formed into a unstretched film webunstretched film web having a length of 3 m, a width of 300 mm and a thickness of 120 μm. The glass transition temperature and the absolute value of the photoelastic coefficient of the obtained unstretched film webunstretched film web are shown in Table 2.

The unstretched film webunstretched film web was stretched obliquely at the stretching temperature and in the draw ratio shown in Table 1 to give a retardation film web. For the oblique stretching treatment for the unstretched film web, used was a simultaneous biaxial stretcher in which the driving speed of each clip can be controlled individually. Using the stretcher, the film was stretched according to a driving method where the clip to hold a marginal portion of one side of the film and the clip to hold a marginal portion of the other side thereof are driven at a different driving speed. The draw ratio is as follows. Lines were drawn in MD (longitudinal direction) and TD (width direction) of the unstretched film, and when the square was deformed into a parallelogram by stretching, the length of the oblique side was divided by the length before the stretching to give the draw ratio. The in-plane retardation value at a wavelength of 550 nm, the angle (orientation angle θ) of the slow axis relative to the width direction, the thickness and the wavelength dispersion of the obtained retardation film web are shown in Table 2. For the oblique stretching, used was a tenter-type stretcher.

<Production of Circularly Polarizing Plate>

The retardation film web produced in the manner as above was continuously stuck to a long polarizing film having an absorption axis in the longitudinal direction according to a roll-to-roll system to produce a laminate film web. The long polarizing film was produced by dyeing a long film of a polyvinyl alcohol resin in an aqueous solution containing iodine, and then monoaxially stretching it by 6 times between rolls having a different speed ratio in an aqueous solution containing boric acid.

An acrylic pressure-sensitive adhesive was applied onto the retardation film web side of the laminate film web, and then cut into a size having a length of 50 mm and a width of 50 mm to give a circularly polarizing plate. The thickness of the obtained circularly polarizing plate is shown in Table 2.

<Production of Organic EL Panel>

The organic EL panel was removed from an organic EL display (LG's trade name: 15EL9500). The polarizing plate stuck to the organic EL panel was peeled off, and in place of it, the above-mentioned circularly polarizing plate was stuck to give a sample of a polarizing EL panel. The reflection color of the obtained organic EL panel is shown in Table 2.

The characteristics of each sample shown in Table 2 were evaluated under the condition mentioned below.

<Glass Transition Temperature>

Using a differential scanning calorimeter (SII Technology's DSC220), about 10 mg of the polycarbonate resin to be analyzed was heated at a heating rate of 10° C./min and analyzed to give a thermal analysis chart. On the chart, the temperature at the intersection between the straight line that extends from the baseline on the low-temperature side toward the high-temperature side and the tangent line drawn at the point at which the inclination of the curve of the stepwise changing part of glass transition is the largest is read to be the extrapolation glass transition onset temperature, according to JIS-K7121 (1987), and this is referred to as the glass transition temperature.

<Photoelastic Coefficient>

The unstretched film web was cut into a rectangular sample having a width of 20 mm and a length of 100 mm. Using an ellipsometer (JASCO's M-150), the sample was analyzed with a light having a wavelength of 550 nm, thereby determining the photoelastic coefficient thereof.

<In-Plane Retardation and Orientation Angle θ>

The unstretched film web was cut into a square sample having a width of 50 mm and a length of 50 mm in such a manner that one side thereof could be parallel to the width direction of the film. Using a Mueller matrix polarimeter (AXOMETRIX's AxoScan), the sample was analyzed to determine the in-plane retardation R450 and R550 at a wavelength of 450 nm and a wavelength of 550 nm, and the orientation angle θ thereof. In measuring the orientation angle θ thereof, the sample was put on a sample bed while kept parallel thereto.

<Thickness>

The retardation film web and the circularly polarizing plate were cut into samples having a suitable size, and the thickness of each sample was measured with a dial gauge (manufactured by Peacock).

<Reflectance and Reflection Color of Organic EL Panel>

Using a spectrophotometer (Konica Minolta's CM-2600d), a sample of the organic EL panel produced in the manner as above was analyzed for the reflectance and the reflection color thereof. Here, as the reflection color, the distance $\Delta u'v'$ from the neutral on the u'v' chromaticity diagram, as represented by the following formula (A), is shown in Table 2. Samples having a smaller value $\Delta u'v'$ are better. In the formula (A), u' and v' each are the value of the chromatic coordinate on the u'v' chromaticity diagram obtained according to the above-mentioned measurement.

[Math. 1]

$$\Delta u'v' = \sqrt{\begin{array}{l}(u' \text{ of circularly polarizing plate} - 0.210)^2 + \\ (v' \text{ of circularly polarizing plate} - 0.471)^2\end{array}} \quad (A)$$

Example 2

A retardation film web having an orientation angle θ of 41° was produced in the same manner as in Example 1, except that the stretching temperature and the draw ratio in the oblique stretching treatment in Example 1 were changed to those as shown in Table 1.

Example 3

A polycarbonate resin B having a copolymerization composition of BHEPF/ISB/PEG#1000=35.7/63.2/1.1 [mol %] was produced in the same manner as in Example 1, except that BHEPF, ISB, PEG#1000, DPC and magnesium acetate 4-hydrate were fed in a ratio by mol of BHEPF/ISB/PEG#1000/DPC/magnesium acetate=0.357/0.632/0.011/1.01/1.00×10$^{-5}$.

A unstretched film web was formed of the polycarbonate resin B in the same manner as in Example 1, and obliquely stretched also in the same manner as in Example 1 to produce a retardation film web having an orientation angle θ of 45°. This was evaluated in the same manner as in Example 1.

Example 4

A polycarbonate resin D having a copolymerization composition of BCF/SPG=30.0/70.0 [mol %] was produced in the same manner as in Example 1, except that BCF, SPG, DPC and calcium acetate 1-hydrate were fed in a ratio by mol of BCF/SPG/DPC/calcium acetate=0.300/0.700/1.020/2.00×10$^{-4}$ and that the final polymerization temperature was 260° C. The reduced viscosity of the polycarbonate resin was 0.482 dL/g, and the glass transition temperature thereof was 135° C. A unstretched film web was formed of the polycarbonate resin D in the same manner as in Example 1, and obliquely stretched also in the same manner as in Example 1 except that the oblique stretching condition was changed as shown in Table 1, thereby producing a retardation film web having an orientation angle θ of 45°. This was evaluated in the same manner as in Example 1.

Example 5

A polycarbonate resin E having a copolymerization composition of BHEPF/BPA=76.0/24.0 [mol %] was produced in the same manner as in Example 1, except that BHEPF, BPA, DPC and calcium acetate 1-hydrate were fed in a ratio by mol of BHEPF/BPA/DPC/calcium acetate=0.760/0.240/1.030/3.01×10$^{-5}$ and that the final polymerization temperature was 260° C. The reduced viscosity of the polycarbonate resin was 0.363 dL/g, and the glass transition temperature thereof was 149° C.

A unstretched film web having a thickness of 270 μm was formed of the polycarbonate resin E in the same manner as in Example 1. The produced, unstretched film web was obliquely stretched also in the same manner as in Example 1 except that the oblique stretching condition was changed as shown in Table 1, thereby producing a retardation film web having an orientation angle θ of 45°. This was evaluated in the same manner as in Example 1.

Example 6

A polyester carbonate resin F of BHEPF/terephthalic acid=72.0/28.0 [mol %] was produced in the same manner as in Example 1, except that BHEPF, DMT, DPC and tetrabutoxytitanium were fed in a ratio by mol of BHEPF/DMT/DPC/tetrabutoxytitanium=1.000/0.390/0.670/2.00×10$^{-4}$ and that the final polymerization temperature was 250° C. The reduced viscosity of the polyester carbonate resin F was 0.277 dL/g, and the glass transition temperature thereof was 153° C.

A unstretched film web having a thickness of 270 μm was formed of the polyester carbonate resin F in the same manner as in Example 1.

The produced, unstretched film web was obliquely stretched also in the same manner as in Example 1 except that the oblique stretching condition was changed as shown in Table 1, thereby producing a retardation film web having an orientation angle θ of 45°. This was evaluated in the same manner as in Example 1.

Example 7

Using the polycarbonate resin A and according to the method described in Example 1, a unstretched film web having a thickness of 100 μm was produced.

The produced, unstretched film web was obliquely stretched also in the same manner as in Example 1 to produce a retardation film web having an orientation angle θ of 45°. This was evaluated in the same manner as in Example 1.

Example 8

Using the polycarbonate resin A and according to the method described in Example 1, a unstretched film web having a thickness of 130 μm was produced. The produced, unstretched film web was obliquely stretched also in the same manner as in Example 1 to produce a retardation film web having an orientation angle θ of 45°. This was evaluated in the same manner as in Example 1.

Example 9

A retardation film web having an orientation angle θ of 39° was produced through the oblique stretching treatment as in Example 1 in which, however, the stretching temperature and the draw ratio were changed as shown in Table 1. This was evaluated in the same manner as in Example 1.

Example 10

A retardation film web having an orientation angle θ of 48° was produced through the oblique stretching treatment as in Example 1 in which, however, the stretching temperature and the draw ratio were changed as shown in Table 1. This was evaluated in the same manner as in Example 1.

Example 11

A retardation film web having an orientation angle θ of 50° was produced through the oblique stretching treatment as in Example 1 in which, however, the stretching temperature and the draw ratio were changed as shown in Table 1. This was evaluated in the same manner as in Example 1.

Comparative Example 1

A polycarbonate resin C having a copolymerization composition of BHEPF/ISB=40.0/60.0 [mol %] was produced in the same manner as in Production Example 1, except that BHEPF, ISB, DPC and magnesium acetate were fed in a ratio by mol of BHEPF/ISB/DPC/magnesium acetate=0.400/0.600/1.01/1.00×10$^{-5}$. The reduced viscosity of the polycarbonate resin was 0.327 dL/g, and the glass transition temperature thereof was 151° C.

A unstretched film web was formed of the polycarbonate resin C in the same manner as in Example 1, and obliquely stretched also in the same manner as in Example 1 so that the orientation angle could be 45°. However, the film was broken. Therefore, using a tenter-type stretcher, the film was transversely monoaxially stretched with the stretching axis kept in the width direction to give a retardation film web having an orientation angle θ of 0°. The draw ratio shown in Table 1 is the maximum draw ratio in TD direction. An acrylic pressure-sensitive adhesive was applied to the obtained, retardation film web, and cut into a piece having a size of 50 mm in width and 50 mm in length in such a manner that one side thereof could be at an angle of 45° relative to the width direction of the retardation film web, thereby producing a pressure-sensitive adhesive-coated retardation film.

Next, a pressure-sensitive adhesive-coated polarizing plate (manufactured by Nitto Denko; trade name: VEGQ1724DUARC9) was cut into a piece having a size of 50 mm in width and 50 mm in length in such a manner that the absorption axis of the film could be parallel to one side thereof. This was stuck to the pressure-sensitive adhesive-coated retardation film in such a manner that the pressure sensitive adhesive surface of the pressure-sensitive adhesive-coated polarizing plate could face the surface of the pressure-sensitive adhesive-coated retardation film opposite to the pressure-sensitive adhesive-coated side thereof to thereby produce a circularly polarizing plate in which the angle between the slow axis and the absorption axis is 45°. The obtained, retardation film web was evaluated in the same manner as in Example 1. The results are shown in Table 3.

Comparative Example 2

A circularly polarizing plate was produced in the same manner as in Comparative Example 1, in which, however, a retardation film web having an orientation angle θ of 90° (manufactured by Teijin Chemical Industry; trade name: Pureace WRF Film) was used in place of the retardation film web in Comparative Example 1.

Comparative Example 3

A laminate film web was produced in the same manner as in Example 1, in which, however, a retardation film web not having reversed wavelength dispersion characteristics (manufactured by Zeon; trade name: ZD12-141083, orientation angle θ: 45°) was used in place of the retardation film web of the polycarbonate resin A in Example 1.

Comparative Example 4

A retardation film web having an orientation angle θ of 37° was produced in the same manner as in Example 1, in which, however, the stretching temperature and the draw ratio in the oblique stretching treatment in Example 1 were changed as shown in Table 1.

Comparative Example 5

A retardation film web having an orientation angle θ of 55° was produced in the same manner as in Example 1, in which, however, the stretching temperature and the draw ratio in the oblique stretching treatment in Example 1 were changed as shown in Table 1.

TABLE 1

|  | Examples 1, 7, 8 | Example 2 | Example 3 | Example 4 | Example 5 | Example 6 |
| --- | --- | --- | --- | --- | --- | --- |
| Stretching Angle (°) | 45 | 41 | 45 | 45 | 45 | 45 |
| Stretching Temperature (° C.) | 136 | 136 | 135 | 145 | 160 | 165 |
| Draw Ratio (%) | 200 | 200 | 200 | 200 | 230 | 230 |

|  | Example 9 | Example 10 | Example 11 | Comparative Example 1 | Comparative Example 4 | Comparative Example 5 |
| --- | --- | --- | --- | --- | --- | --- |
| Stretching Angle (°) | 39 | 48 | 50 | 0 | 37 | 55 |
| Stretching Temperature (° C.) | 134.5 | 136.5 | 137 | 152 | 134.5 | 137 |
| Draw Ratio (%) | 210 | 215 | 220 | 260 | 205 | 240 |

TABLE 2

|  | Item | Example 1 | Example 2 | Example 3 | Example 4 | Example 5 | Example 6 |
| --- | --- | --- | --- | --- | --- | --- | --- |
| Unstretched film web | glass transition temperature (° C.) | 128 | 128 | 132 | 135 | 149 | 154 |
|  | photoelastic coefficient (Pa$^{-1}$) | $4.1 \times 10^{-11}$ | $4.1 \times 10^{-11}$ | $3.5 \times 10^{-11}$ | $1.9 \times 10^{-11}$ | $5.2 \times 10^{-11}$ | $6.3 \times 10^{-11}$ |
| Retardation film web | orientation angle θ (°) | 45 | 41 | 45 | 45 | 45 | 45 |
|  | wavelength dispersion (R450/R550) | 0.91 | 0.91 | 0.94 | 0.92 | 0.87 | 0.93 |
|  | film retardation (nm) | 141 | 142 | 141 | 140 | 137 | 137 |
|  | thickness (μm) | 68 | 67 | 68 | 68 | 135 | 135 |
| Circularly Polarizing Plate | thickness (μm) | 154 | 153 | 154 | 154 | 221 | 221 |
|  | roll-to-roll lamination | possible | possible | possible | possible | possible | possible |
| Organic EL Panel | reflectance (%) | 2.3 | 2.64 | 2.35 | 2.34 | 2.3 | 2.35 |
|  | reflection color u' | 0.199 | 0.206 | 0.205 | 0.204 | 0.211 | 0.216 |
|  | v' | 0.448 | 0.462 | 0.445 | 0.447 | 0.467 | 0.453 |
|  | distance from neutral color phase Δu'v' | 0.025 | 0.010 | 0.027 | 0.025 | 0.005 | 0.019 |

|  | Item | Example 7 | Example 8 | Example 9 | Example 10 | Example 11 |
| --- | --- | --- | --- | --- | --- | --- |
| Unstretched film web | glass transition temperature (° C.) | 128 | 128 | 128 | 128 | 128 |
|  | photoelastic coefficient (Pa$^{-1}$) | $4.1 \times 10^{-11}$ | $4.1 \times 10^{-11}$ | $4.1 \times 10^{-11}$ | $4.1 \times 10^{-11}$ | $4.1 \times 10^{-11}$ |
| Retardation film web | orientation angle θ (°) | 45 | 45 | 39 | 48 | 50 |
|  | wavelength dispersion (R450/R550) | 0.91 | 0.91 | 0.91 | 0.91 | 0.91 |
|  | film retardation (nm) | 120 | 150 | 141 | 142 | 142 |
|  | thickness (μm) | 58 | 73 | 61 | 68 | 70 |
| Circularly Polarizing Plate | thickness (μm) | 144 | 159 | 147 | 154 | 156 |
|  | roll-to-roll lamination | possible | possible | possible | possible | possible |
| Organic EL Panel | reflectance (%) | 2.98 | 2.7 | 2.7 | 2.45 | 2.92 |
|  | reflection color u' | 0.239 | 0.189 | 0.215 | 0.211 | 0.214 |
|  | v' | 0.494 | 0.454 | 0.471 | 0.465 | 0.468 |
|  | distance from neutral color phase Δu'v' | 0.037 | 0.027 | 0.006 | 0.007 | 0.006 |

TABLE 3

| Item | | Comparative Example 1 | Comparative Example 2 | Comparative Example 3 | Comparative Example 4 | Comparative Example 5 |
|---|---|---|---|---|---|---|
| Unstretched film web | glass transition temperature (° C.) | 151 | 225 | 126 | 128 | 128 |
| | photoelastic coefficient ($Pa^{-1}$) | $4.2 \times 10^{-11}$ | $5.5 \times 10^{-11}$ | $4.0 \times 10^{-12}$ | $4.1 \times 10^{-11}$ | $4.1 \times 10^{-11}$ |
| Retardation film web | orientation angle θ (°) | 0 | 90 | 45 | 37 | 55 |
| | wavelength dispersion (R450/R550) | 0.89 | 0.89 | 1 | 0.91 | 0.91 |
| | film retardation (nm) | 141 | 147 | 141 | 139 | 141 |
| | thickness (μm) | 50 | 50 | 32 | 68 | 68 |
| Circularly Polarizing Plate | thickness (μm) | 279 | 279 | 111 | 154 | 154 |
| | roll-to-roll lamination | impossible | impossible | possible | possible | possible |
| Organic EL Panel | reflectance (%) | 2.25 | 2.38 | 2.39 | 3.45 | 4.91 |
| | reflection color u' | 0.203 | 0.194 | 0.205 | 0.217 | 0.213 |
| | v' | 0.454 | 0.452 | 0.416 | 0.477 | 0.484 |
| | distance from neutral color phase Δu'v' | 0.019 | 0.024 | 0.055 | 0.009 | 0.013 |

As known from Table 2, when a circularly polarizing plate using a retardation film, which includes a polycarbonate resin or a polyester carbonate resin and of which the orientation angle θ and the wavelength dispersion satisfy the above-mentioned formula (I) and the above-mentioned formula (II), is stuck to an organic EL panel, it is possible to make the reflection color from the organic EL panel black. Also as known from Table 3, when the orientation angle θ is greatly outside the formula (I), it is impossible to employ a so-called roll-to-roll system where the lamination with a long polarizing film is carried out continuously.

While the invention has been described in detail with reference to specific examples thereof, it will be apparent to one skilled in the art that various changes and modifications can be made therein without departing from the spirit and scope thereof. The present application is based on a Japanese patent application filed on Mar. 30, 2012 (Application No. 2012-080628), a Japanese patent application filed on Aug. 1, 2012 (Application No. 2012-171507) and a Japanese patent application filed on Mar. 19, 2013 (Application No. 2013-057082), the contents of which are incorporated herein by reference.

The invention claimed is:

1. A retardation film web, comprising:
 a polycarbonate resin or a polyester carbonate resin,
 wherein an orientation angle θ which is an angle between a slow axis and a width direction satisfies formula (I):

$$38° \leq \theta \leq 52° \quad (I)$$

and
 a ratio of an in-plane retardation R450 measured at a wavelength of 450 nm to an in-plane retardation R550 measured at a wavelength of 550 nm satisfies formula (II):

$$R450/R550 < 1 \quad (II),$$

wherein the polycarbonate resin or the polyester carbonate resin comprises a structural unit derived from a dihydroxy compound having a cyclic ether structure.

2. The retardation film web according to claim 1, wherein a glass transition temperature of the polycarbonate resin or the polyester carbonate resin is 190° C. or lower.

3. The retardation film web according to claim 1, wherein the polycarbonate resin or the polyester carbonate resin comprises a structural unit having a 9,9-diarylfluorene structure.

4. The retardation film web according to claim 1, wherein the polycarbonate resin or the polyester carbonate resin comprises a structural unit having a bonding structure represented by structural formula (1):

5. The retardation film web according to claim 3, wherein the polycarbonate resin or the polyester carbonate resin comprises a structural unit derived from a dihydroxy compound represented by formula (2):

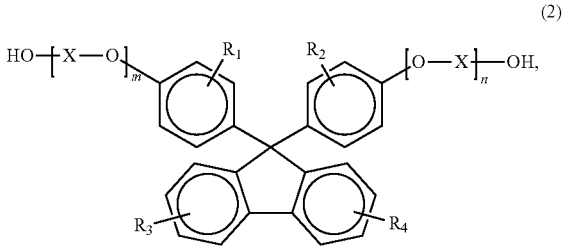

wherein $R_1$ to $R_4$ each independently represent a hydrogen atom, a substituted or unsubstituted alkyl group having from 1 to 20 carbon atoms, a substituted or unsubstituted cycloalkyl group having from 6 to 20 carbon atoms, or a substituted or unsubstituted aryl group having from 6 to 20 carbon atoms, and as four substituents of benzene rings, the same or different groups thereof are arranged, X represents a substituted or unsubstituted alkylene group having from 2 to 10 carbon atoms, a substituted or unsubstituted cycloalkylene group having from 6 to 20 carbon atoms, or a substituted or unsubstituted arylene group having from 6 to 20 carbon atoms; and m and n each independently indicate an integer of from 0 to 5.

6. The retardation film web according to claim 1, wherein the polycarbonate resin or the polyester carbonate resin comprises a structural unit derived from a dihydroxy compound represented by formula (3):

wherein $R_5$ represents a substituted or unsubstituted alkylene group having from 2 to 10 carbon atoms; and p indicates an integer of from 2 to 100.

7. The retardation film web according to claim 1,
wherein the polycarbonate resin or the polyester carbonate resin comprises a structural unit derived from a dihydroxy compound represented by structural formula (6):

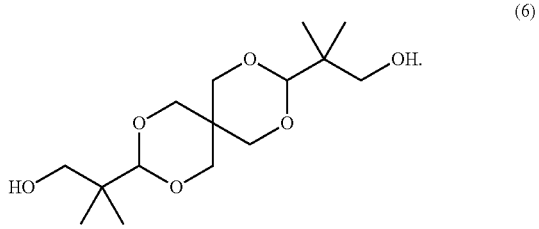

(6)

8. The retardation film web according to claim 1,
wherein the polycarbonate resin or the polyester carbonate resin comprises a structural unit derived from a dihydroxy compound represented by formula (4):

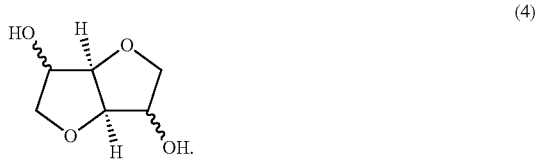

(4)

9. The retardation film web according to claim 1,
wherein the retardation film web has a thickness of 100 μm or less, and
the in-plane retardation R550 thereof measured at a wavelength of 550 nm is from 100 to 160 nm.

10. A laminate film web, comprising:
the retardation film web according to claim 1; and
a polarizing film web,
wherein the retardation film web is laminated with the polarizing film web having an absorption axis in any of a longitudinal direction and a width direction thereof, in such a manner that their longitudinal directions are aligned with each other.

11. A circularly polarizing plate obtained by cutting the laminate film web according to claim 10.

12. The circularly polarizing plate according to claim 11, the circularly polarizing plate has a thickness of 200 μm or less.

13. An organic EL panel, comprising:
the circularly polarizing plate according to claim 11.

14. A method for producing a circularly polarizing plate, the method comprising:
feeding, in a longitudinal direction thereof, a retardation film web comprising a polycarbonate resin or a polyester carbonate resin, in which an orientation angle θ which is an angle between a slow axis and a width direction satisfies formula (I) of $38° \leq \theta \leq 52°$ (I), and a ratio of an in-plane retardation R450 measured at a wavelength of 450 nm to an in-plane retardation R550 measured at a wavelength of 550 nm satisfies formula (II):

$R450/R550 < 1$ (II);

feeding, in a longitudinal direction thereof, a polarizing film web having an absorption axis in any of the longitudinal direction and a width direction thereof; and
laminating the retardation film web and the polarizing film web in such a manner that their longitudinal directions are aligned with each other to thereby continuously form a laminate film,
wherein the polycarbonate resin or the polyester carbonate resin comprises a structural unit derived from a dihydroxy compound having a cyclic ether structure.

* * * * *